(12) United States Patent
Higuchi et al.

(10) Patent No.: US 10,072,929 B2
(45) Date of Patent: Sep. 11, 2018

(54) CIRCUIT DEVICE, ELECTRONIC APPARATUS, MOVING OBJECT AND METHOD OF MANUFACTURING OF PHYSICAL QUANTITY DETECTION DEVICE

(71) Applicant: Seiko Epson Corporation, Tokyo (JP)

(72) Inventors: Teppei Higuchi, Chino (JP); Katsuhiko Maki, Chino (JP)

(73) Assignee: Seiko Epson Corporation (JP)

( * ) Notice: Subject to any disclaimer, the term of this patent is extended or adjusted under 35 U.S.C. 154(b) by 223 days.

(21) Appl. No.: 14/996,524

(22) Filed: Jan. 15, 2016

(65) Prior Publication Data

US 2016/0216113 A1   Jul. 28, 2016

(30) Foreign Application Priority Data

Jan. 22, 2015 (JP) .................................. 2015-010023

(51) Int. Cl.
| | |
|---|---|
| G01C 19/56 | (2012.01) |
| G01C 19/5614 | (2012.01) |
| G01C 19/5649 | (2012.01) |
| G01C 19/5628 | (2012.01) |
| H03B 5/04 | (2006.01) |

(52) U.S. Cl.
CPC ..... G01C 19/5614 (2013.01); G01C 19/5628 (2013.01); G01C 19/5649 (2013.01); H03B 5/04 (2013.01)

(58) Field of Classification Search
CPC .......... G01N 19/5614; G01N 19/5628; G01C 19/5649; G01C 19/5614; G01C 19/5628; H03B 5/04; H03B 5/24; H03B 5/36
See application file for complete search history.

(56) References Cited

U.S. PATENT DOCUMENTS

| | | | | |
|---|---|---|---|---|
| 8,122,587 B2* | 2/2012 | Kawashima | ............ | H03B 5/32 216/13 |
| 2007/0024386 A1* | 2/2007 | Yamamoto | ............... | H03B 5/36 331/158 |
| 2008/0016666 A1* | 1/2008 | Takahashi | ............. | H03H 9/215 29/25.35 |
| 2008/0105054 A1 | 5/2008 | Kanai et al. | | |

(Continued)

FOREIGN PATENT DOCUMENTS

| | | |
|---|---|---|
| JP | 2005-167927 A | 6/2005 |
| JP | 2008-139287 A | 6/2008 |

(Continued)

*Primary Examiner* — Lisa Caputo
*Assistant Examiner* — David Z Huang
(74) *Attorney, Agent, or Firm* — Harness, Dickey & Pierce, P.L.C.

(57) ABSTRACT

A circuit device includes a clock signal generation circuit that generates a clock signal through an oscillation circuit, and a detection circuit including a circuit operating through an operation signal based on the clock signal. The clock signal generation circuit includes a first frequency adjustment unit which is capable of adjusting an oscillation frequency before an physical quantity transducer and the circuit device are connected to each other, and a second frequency adjustment unit which is capable of adjusting the oscillation frequency in a state where the physical quantity transducer and the circuit device are connected to each other.

20 Claims, 19 Drawing Sheets

(56) References Cited

U.S. PATENT DOCUMENTS

| | | | |
|---|---|---|---|
| 2010/0079035 A1* | 4/2010 | Matsuzawa | B29C 39/10 |
| | | | 310/340 |
| 2010/0126271 A1 | 5/2010 | Inukai et al. | |
| 2010/0271144 A1* | 10/2010 | McCorquodale | H03B 5/04 |
| | | | 331/117 FE |
| 2011/0050046 A1* | 3/2011 | Onitsuka | G04R 20/10 |
| | | | 310/344 |
| 2013/0009714 A1* | 1/2013 | Nishitani | H01L 28/40 |
| | | | 331/108 B |
| 2015/0145609 A1 | 5/2015 | Higuchi et al. | |

FOREIGN PATENT DOCUMENTS

| | | |
|---|---|---|
| JP | 2009-162645 A | 7/2009 |
| JP | 2013-058947 A | 3/2013 |

* cited by examiner

CIRCUIT DEVICE, ELECTRONIC APPARATUS, MOVING OBJECT AND METHOD OF MANUFACTURING OF PHYSICAL QUANTITY DETECTION DEVICE

BACKGROUND

1. Technical Field

The present invention relates to a circuit device, an electronic apparatus, a moving object, a method of manufacturing a physical quantity detection device, and the like.

2. Related Art

Hitherto, circuit devices that detect a physical quantity on the basis of a detection signal from a physical quantity transducer have been known. When a gyro sensor is taken by way of example, the circuit device detects an angular velocity or the like as a physical quantity. The gyro sensor is incorporated into electronic apparatuses such as, for example, a digital camera and a smartphone, or moving objects such as a vehicle and an airplane, and performs shaking correction, posture control, GPS autonomous navigation, or the like using a physical quantity such as the detected angular velocity. As the related art of the circuit device of the gyro sensor, techniques disclosed in, for example, JP-A-2008-139287 and JP-A-2009-162645 have been known.

In the related art of JP-A-2008-139287, a detection circuit is operated by a signal based on a drive signal of a drive circuit that drives a physical quantity transducer, but the drive frequency of the drive signal is not very high (for example, 50 to 150 KHz). For this reason, for example, when the detection circuit is provided with a circuit for detecting a physical quantity such as an A/D conversion circuit or a DSP unit (digital signal processing unit), there is a problem in that high-speed operations of these circuits are not likely to be realized.

In this case, when a method is adopted in which a circuit device is provided with a clock signal generation circuit including an oscillation circuit, and a high-speed clock signal is generated by this clock signal generation circuit, it is possible to realize the high-speed operations of these circuits.

However, when this method is adopted and a physical quantity detection device is configured by the physical quantity transducer and the circuit device being connected to each other, a drive frequency component of the drive signal that drives the physical quantity transducer influences a circuit operating through a signal based on the clock signal generated by the clock signal generation circuit, which leads to the possibility of detection performance deteriorating.

Meanwhile, JP-A-2009-162645 discloses a method providing a CR oscillation circuit to a circuit device, and generating a clock signal of an abnormality detection circuit through the CR oscillation circuit, but a circuit operating through a signal based on the clock signal in JP-A-2009-162645 is not a circuit for detecting a physical quantity such an A/D conversion circuit or a DSP unit.

SUMMARY

An advantage of some aspects of the invention is to make it possible to provide a circuit device, an electronic apparatus, a moving object, a method of manufacturing a physical quantity detection device, and the like which are capable of reducing a deterioration in detection performance occurring due to the influence of a drive frequency component of a physical quantity transducer on a detection circuit having a circuit operating through a signal based on a clock signal generated by a clock signal generation circuit.

The invention can be implemented as the following forms or application examples.

An aspect of the invention relates to a circuit device including: a clock signal generation circuit, including an oscillation circuit, which generates a clock signal through the oscillation circuit; and a detection circuit, including a circuit operating through an operation signal based on the clock signal, to which a detection signal from a physical quantity transducer is input, wherein the clock signal generation circuit includes a first frequency adjustment unit which is capable of adjusting an oscillation frequency of the oscillation circuit before the physical quantity transducer and the circuit device are connected to each other, and a second frequency adjustment unit which is capable of adjusting the oscillation frequency of the oscillation circuit in a state where the physical quantity transducer and the circuit device are connected to each other.

According to the aspect of the invention, the circuit of the detection circuit operates through the operation signal based on the clock signal generated by the clock signal generation circuit including the oscillation circuit. As the frequency adjustment of the oscillation frequency of the oscillation circuit of the clock signal generation circuit that generates such a clock signal, the adjustment of the oscillation frequency by the first frequency adjustment unit is performed before the physical quantity transducer and the circuit device are connected to each other. Further, the adjustment of the oscillation frequency by the second frequency adjustment unit is performed in a state where the physical quantity transducer and the circuit device are connected to each other. With such a configuration, even when there is the possibility of detection performance deteriorating due to the physical quantity transducer and the circuit device being connected to each other, the circuit of the detection circuit operating through the operation signal based on the clock signal can reduce the deterioration of the detection performance by adjusting the oscillation frequency through the second frequency adjustment unit.

In the aspect of the invention, the oscillation circuit may be a CR oscillation circuit, and the first frequency adjustment unit may be a variable resistance circuit of the CR oscillation circuit.

With such a configuration, the resistance value of the variable resistance circuit is adjusted, and thus the coarse adjustment or the like of the oscillation frequency of the CR oscillation circuit can be realized in a state before the physical quantity transducer and the circuit device are connected to each other.

In the aspect of the invention, the CR oscillation circuit may include an amplifier circuit, and the variable resistance circuit may be a resistance circuit that feeds back a signal of the amplifier circuit to an input node of the amplifier circuit.

As in this manner, the resistance value of the variable resistance circuit that feeds back the signal of the amplifier circuit to the input node of the amplifier circuit is adjusted, and thus the oscillation frequency of the CR oscillation circuit can be appropriately adjusted in a state before the circuit device and the physical quantity transducer are connected to each other.

In the aspect of the invention, the variable resistance circuit may include a plurality of resistive elements which are connected in series to each other, and a plurality of fuse elements in which each fuse element is provided in parallel to each resistive element of the plurality of resistive elements.

With such a configuration, each fuse element of the variable resistance circuit is cut off in a state before the circuit device and the physical quantity transducer are connected to each other, and thus a target oscillation frequency can be set by adjusting the oscillation frequency of the CR oscillation circuit.

In the aspect of the invention, the variable resistance circuit may include a reference resistive element which is connected in series to the plurality of resistive elements, and a trimming auxiliary switch, provided in parallel to the reference resistive element, which is turned off in a first measurement mode of the oscillation frequency before fuse cut, and is turned on in a second measurement mode of the oscillation frequency before the fuse cut.

With such a configuration, the oscillation frequency can be measured by turning off the trimming auxiliary switch in the first measurement mode before the fuse cut, and the oscillation frequency can be measured by turning on the trimming auxiliary switch in the second measurement mode. Which of the plurality of fuse elements is cut can be determined using the oscillation frequency measured in this manner.

In the aspect of the invention, the oscillation circuit may be a CR oscillation circuit, and the second frequency adjustment unit may be a variable capacitance circuit of the CR oscillation circuit.

With such a configuration, the capacitance value of the variable capacitance circuit is adjusted, and thus the fine adjustment or the like of the oscillation frequency of the CR oscillation circuit can be realized in a state after the physical quantity transducer and the circuit device are connected to each other.

In the aspect of the invention, the CR oscillation circuit may include an amplifier circuit, and the variable capacitance circuit may be provided to an output node of the amplifier circuit.

As in this manner, the capacitance value of the variable capacitance circuit which is provided to the output node of the amplifier circuit is adjusted, and thus the oscillation frequency of the CR oscillation circuit can be appropriately adjusted in a state after the circuit device and the physical quantity transducer are connected to each other.

In the aspect of the invention, the circuit device may further include a voltage generation circuit that generates a power supply voltage, and supplies the power supply voltage to the oscillation circuit, and the voltage generation circuit may generate a power supply voltage for compensating for temperature characteristics of the oscillation frequency of the oscillation circuit.

With such a configuration, even when a temperature changes, the power supply voltage for canceling a fluctuation in the oscillation frequency due to the temperature change is supplied to the oscillation circuit, and thus it is possible to effectively reduce a fluctuation in the oscillation frequency due to the temperature change.

In the aspect of the invention, the oscillation frequency in a case where the power supply voltage is a fixed voltage may have positive temperature characteristics, and the voltage generation circuit may generate the power supply voltage having negative temperature characteristics on the basis of a work function difference of a transistor, and supply the power supply voltage as a power supply of the oscillation circuit.

With such a configuration, at least a portion of the positive temperature characteristics of the oscillation frequency of the CR oscillation circuit is canceled by the negative temperature characteristics of the power supply voltage, and thus it is possible to reduce a fluctuation in the oscillation frequency with respect to the temperature fluctuation.

In the aspect of the invention, the voltage generation circuit may supply a first voltage as the power supply voltage when the physical quantity transducer which is connected to the circuit device is a first physical quantity transducer, and supply a second voltage different from the first voltage as the power supply voltage when the physical quantity transducer which is connected to the circuit device is a second physical quantity transducer having a drive frequency different from that of the first physical quantity transducer.

With such a configuration, in a case where the physical quantity transducer which is connected to the circuit device is the first physical quantity transducer and a case where the physical quantity transducer is the second physical quantity transducer, different power supply voltages are supplied to the CR oscillation circuit, and thus the oscillation frequency of the oscillation circuit can be set to a different frequency.

In the aspect of the invention, the detection circuit may include an A/D conversion circuit that performs a sampling operation of an input signal on the basis of a sampling clock signal which is the operation signal.

With such a configuration, the sampling clock signal based on the clock signal generated by the clock signal generation circuit is supplied to the A/D conversion circuit, and thus it is possible to cause the A/D conversion circuit to perform the sampling operation.

In the aspect of the invention, the detection circuit may include a digital signal processing unit that performs digital signal processing on the basis of an operation clock signal which is the operation signal.

With such a configuration, the operation clock signal based on the clock signal generated by the clock signal generation circuit is supplied to the digital signal processing unit, and thus it is possible to cause the digital signal processing unit to perform various types of digital signal processing.

In the aspect of the invention, the circuit device may further include a drive circuit that receives a feedback signal from the physical quantity transducer, and drives the physical quantity transducer.

With such a configuration, it is possible to realize a process of detecting the detection circuit based on the detection signal from the physical quantity transducer while the physical quantity transducer is driven by the drive circuit on the basis of the feedback signal from the physical quantity transducer.

In the aspect of the invention, when the oscillation frequency of the oscillation circuit is set to fos, i is set to an integer of 1 or greater, j is set to an integer of 1 or greater, and a frequency of the operation signal is set to fos/i, the oscillation frequency fos may be set so that a relation of j×fdr≠fos/i is established.

With such a configuration, the oscillation frequency can be set to a frequency keeping out of interference between the harmonic component or the fundamental mode component of the drive frequency and the frequency component of the operation signal.

In the aspect of the invention, when k is set to an integer of 1 or greater, the oscillation frequency fos may be set so that a relation of j×fdr≠k×fos/i is established.

With such a configuration, the oscillation frequency can be set to a frequency keeping out of interference between the harmonic component or the fundamental mode component of the drive frequency and the harmonic component or the fundamental mode component of the operation signal.

Another aspect of the invention relates to an electronic apparatus including the circuit device according to any one of the aspects.

Still another aspect of the invention relates to a moving object including the circuit device according to any one of the aspects.

Yet another aspect of the invention relates to a method of manufacturing a physical quantity detection device including a physical quantity transducer and a circuit device. The method includes: manufacturing a circuit device that includes a clock signal generation circuit, including an oscillation circuit, which generates a clock signal through the oscillation circuit, and a detection circuit, including a circuit operating through an operation signal based on the clock signal, to which a detection signal from the physical quantity transducer is input; firstly adjusting an oscillation frequency of the oscillation circuit before the physical quantity transducer and the circuit device are connected to each other; and secondly adjusting the oscillation frequency of the oscillation circuit in a state where the physical quantity transducer and the circuit device are connected to each other.

According to the aspect of the invention, as the frequency adjustment of the oscillation frequency of the oscillation circuit included in the clock signal generation circuit, the adjustment of the oscillation frequency by the first frequency adjustment is performed before the physical quantity transducer and the circuit device are connected to each other. Further, the adjustment of the oscillation frequency by the second frequency adjustment is performed in a state where the physical quantity transducer and the circuit device are connected to each other. With such a configuration, even when there is the possibility of detection performance deteriorating due to the detection circuit operating the operation signal based on the clock signal being influenced by connection between the physical quantity transducer and the circuit device, the oscillation frequency is adjusted by the second frequency adjustment, and thus it is possible to reduce the deterioration of the detection performance.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of the invention will be described in detail. Meanwhile, the embodiments described below do not unduly limit the content of the invention described in the appended claims, and all the configurations described in the embodiments are not necessarily essential as solving means of the invention.

1. Circuit Device

Figure 1:
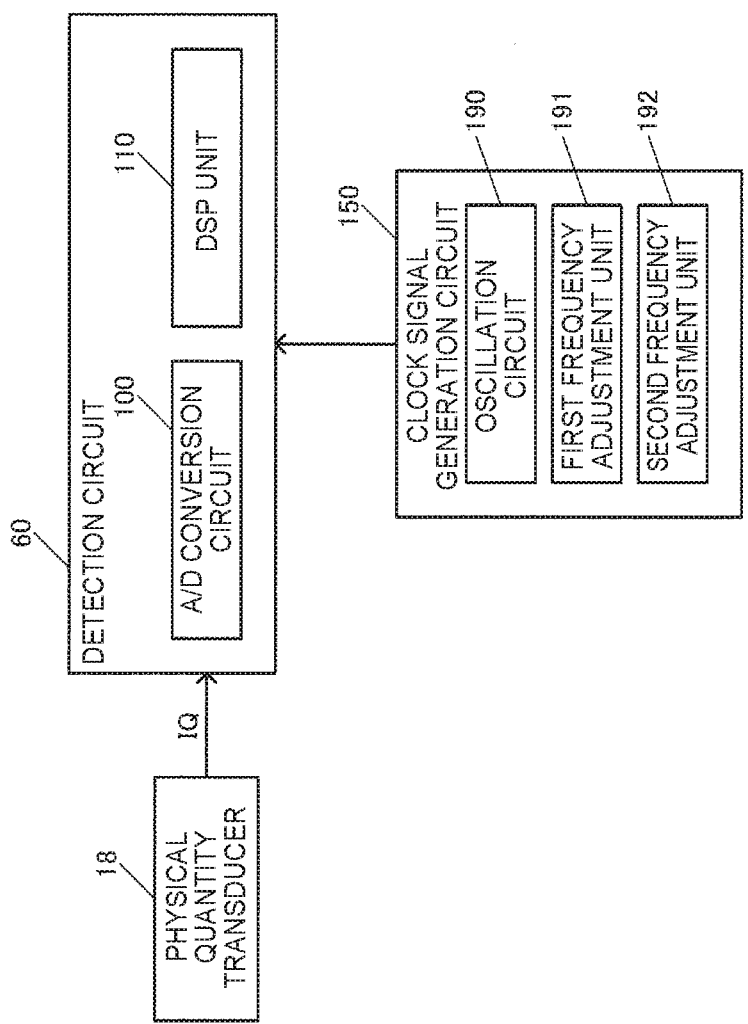
FIG. 1 is a configuration example of a circuit device of the present embodiment.

FIG. 1 illustrates a basic configuration example of a circuit device (detection device) of the present embodiment. The circuit device of the present embodiment includes a detection circuit 60 and a clock signal generation circuit 150. A physical quantity detection device (sensor device) is constituted by this circuit device and a physical quantity transducer 18. Meanwhile, the circuit device of the present embodiment and the physical quantity detection device are not limited to the configuration of FIG. 1, and various modifications such as omissions of some of the components or additions of other components can be made.

The clock signal generation circuit 150 includes an oscillation circuit 190, and generates a clock signal through the oscillation circuit 190. That is, a clock signal is generated by an oscillation operation of the oscillation circuit 190. As the oscillation circuit 190, a CR oscillation circuit or the like that oscillates using a resistor and a capacitor can be used.

A detection signal from the physical quantity transducer 18 is input to the detection circuit 60. The detection circuit 60 performs a detection process of a physical quantity (desired signal) on the basis of the detection signal from the physical quantity transducer 18. In addition, the detection circuit 60 includes circuits that operate through an operation signal based on a clock signal generated by the clock signal generation circuit 150. In FIG. 1, as the circuits that operate through the operation signal based on the clock signal, an A/D conversion circuit 100 and a DSP unit 110 (digital signal processing unit) are provided in the detection circuit 60.

Meanwhile, the circuits that operate through the operation signal based on the clock signal are not limited to these circuits. For example, as the circuits that operate through the operation signal, only one of the A/D conversion circuit 100 and the DSP unit 110 may be provided, and a circuit for detecting a physical quantity different from those of the A/D conversion circuit 100 and the DSP unit 110 may be provided.

In addition, the operation signal based on the clock signal may be a signal obtained by frequency-dividing the clock signal, and may be a signal having the same frequency as that of the clock signal (signal obtained by buffering the clock signal itself or the clock signal).

For example, in FIG. 1, the operation signal based on the clock signal is a sampling clock signal of the A/D conversion circuit 100 or an operation clock signal of the DSP unit 110. The sampling clock signal and the operation clock signal are signals obtained by frequency-dividing a clock signal. For example, the A/D conversion circuit 100 performs a sampling operation of an input signal on the basis of the sampling clock signal which is an operation signal. A/D conversion is performed on a signal sampled on the basis of the sampling clock signal. In addition, the DSP unit 110 performs digital signal processing on the basis of the operation clock signal which is an operation signal. For example, as digital signal processing, digital filter processing (such as low-pass filter processing) is performed. Alternatively, various types of digital correction processing are performed.

In the present embodiment, the clock signal generation circuit 150 includes a first frequency adjustment unit 191 and a second frequency adjustment unit 192. The first frequency adjustment unit 191 is a frequency adjustment unit capable of adjusting the oscillation frequency of the oscillation circuit 190 before the physical quantity transducer 18 and the circuit device are connected to each other. The second frequency adjustment unit 192 is a frequency adjustment unit capable of adjusting the oscillation frequency of the oscillation circuit 190 in a state where the physical quantity transducer 18 and the circuit device are connected to each other.

A first frequency adjustment which is performed by the first frequency adjustment unit 191 is, for example, a coarse adjustment of the oscillation frequency of the oscillation circuit 190. A second frequency adjustment which is performed by the second frequency adjustment unit 192 is, for example, a fine adjustment of the oscillation frequency. For example, the second frequency adjustment has an adjustment resolution higher than that of the first frequency adjustment. In addition, for example, the adjustment range of the first frequency adjustment is wide, and the adjustment range of the second frequency adjustment is narrower than the adjustment range of the first frequency adjustment.

For example, the chip of the circuit device is formed by dicing a semiconductor wafer. The circuit device and the physical quantity transducer 18 are housed in the package of the physical quantity detection device (sensor device). The terminal of the circuit device and the terminal of the physical quantity transducer 18 are electrically connected to each other by a metal wire or the like. That is, the physical quantity detection device is constituted by the package, the physical quantity transducer 18, and the circuit device (semiconductor chip) which is connected to the physical quantity transducer 18 and is housed in the package together with the physical quantity transducer 18. The first frequency adjustment which is performed by the first frequency adjustment unit 191 is an adjustment of the oscillation frequency which is performed before connection between such a circuit device and the physical quantity transducer 18. On the other hand, the second frequency adjustment which is performed by the second frequency adjustment unit 192 is an adjustment of the oscillation frequency which is performed after connection between the circuit device and the physical quantity transducer 18.

For example, the first frequency adjustment is performed in an inspection in the state of the semiconductor wafer. For example, the semiconductor wafer having a plurality of circuit devices formed thereon is manufactured, a pad of each circuit device is probed by a tester in the state of the semiconductor wafer, and the inspection of each circuit device is executed. In this inspection, for example, the oscillation frequency of each circuit device is measured, and the adjustment (coarse adjustment) of the oscillation frequency by the first frequency adjustment unit 191 is performed. The adjustment of the oscillation frequency can be realized by, for example, fuse cut or the like described later. Meanwhile, the first frequency adjustment may be performed before connection between the circuit device and the physical quantity transducer 18, and there is no limitation to the adjustment of the oscillation frequency which is performed in such a state of the semiconductor wafer.

After the first frequency adjustment is performed in this manner, the semiconductor wafer is diced, and the chip of each circuit device is separated. The circuit device and the physical quantity transducer 18 are housed in the package and are electrically connected to each other, and the physical quantity detection device is manufactured. In the module inspection of the physical quantity detection device, the second frequency adjustment is performed by the second frequency adjustment unit 192. That is, the second frequency adjustment which is a fine adjustment is performed on the first frequency adjustment which is a coarse adjustment. Specifically, for example, as described later, a drive frequency is measured, and the second frequency adjustment is performed in which the oscillation frequency of the oscillation circuit 190 is set to a frequency keeping out of an interference frequency.

The oscillation circuit 190 is, for example, a CR oscillation circuit as described later. Meanwhile, an oscillation circuit of a system different from that of the CR oscillation circuit may be adopted. For example, the oscillation operation of the oscillation circuit 190 may be realized using another vibrator (such as a quartz crystal vibrator). When the CR oscillation circuit is used as the oscillation circuit 190, the first frequency adjustment can be realized by, for example, the adjustment of the resistance value of the CR oscillation circuit, and the second frequency adjustment can be realized by, for example, the adjustment of the capacitance value of the CR oscillation circuit. Meanwhile, various modifications can be made in which the first frequency adjustment is realized by the adjustment of the capacitance value, the second frequency adjustment is realized by the adjustment of the resistance value, one of the first and second frequency adjustments is realized by the adjustment of a circuit constant parameter (for example, power supply voltage value) other than the capacitance value or the resistance value, or the like.

Figure 2:
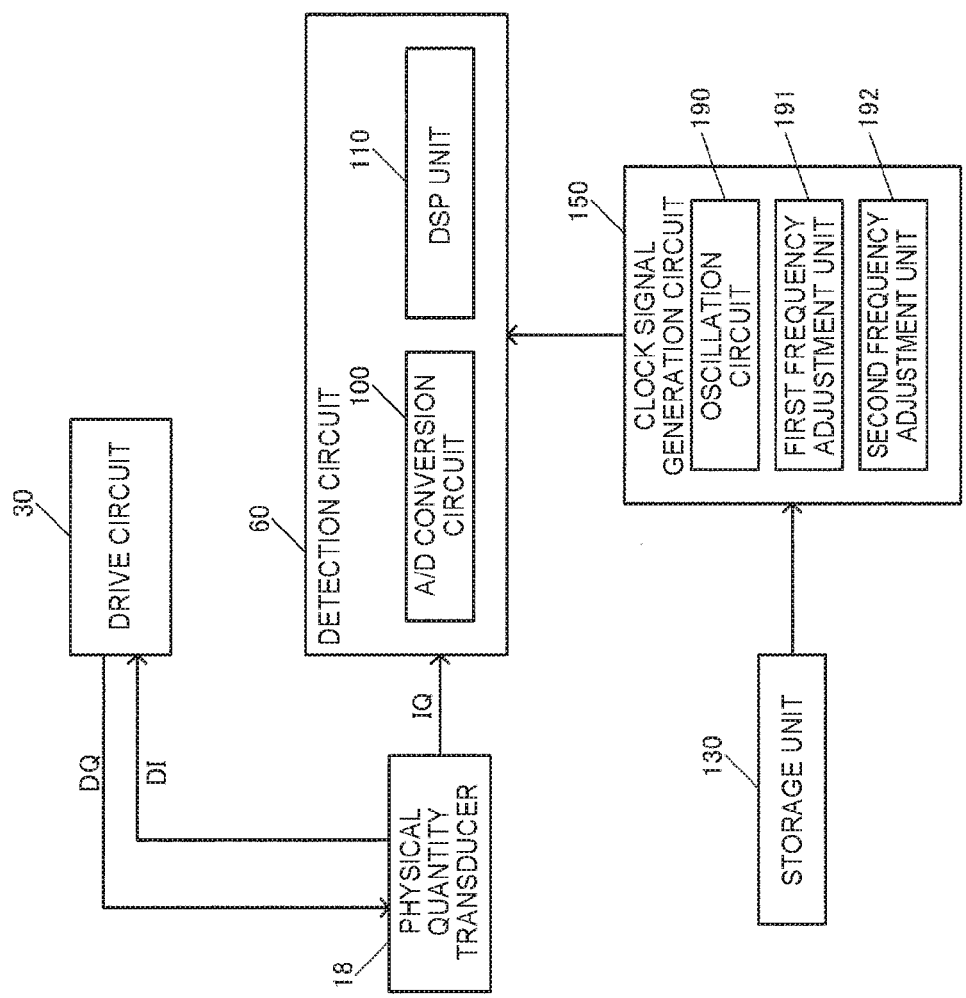
FIG. 2 is an example of a specific configuration of the circuit device of the present embodiment.

FIG. 2 illustrates an example of the specific configuration of the circuit device. In FIG. 2, the circuit device includes a drive circuit 30. In addition, the circuit device is further provided with a storage unit 130.

The drive circuit 30 receives a feedback signal DI from the physical quantity transducer 18, and drives the physical quantity transducer 18. For example, the drive circuit 30 receives the feedback signal DI from the physical quantity transducer 18, and outputs a drive signal DQ of a square wave or a sinusoidal wave to the physical quantity transducer 18. Thereby, the physical quantity transducer 18 is driven at a constant drive frequency, and performs a vibration or the like at, for example, a frequency corresponding to the drive frequency.

The storage unit 130 stores a frequency adjustment value of the oscillation frequency. For example, the storage unit stores a frequency adjustment value of the oscillation frequency based on the second frequency adjustment unit 192. That is, the storage unit stores a frequency adjustment value of the second frequency adjustment which is performed in a state where the physical quantity transducer 18 and the circuit device are connected to each other. For example, the storage unit 130 can be constituted by a non-volatile memory. As the non-volatile memory, for example, an EPROM, an EEPROM, a flash memory, or the like can be used. As the EPROM, for example, a one-time PROM (OTP) or the like can be used. As the OTP, for example, MONOS (Metal-Oxide-Nitride-Oxide-Silicon) or the like can be used. Meanwhile, as the storage unit 130, a storage device (such as, for example, a storage device using a fuse) other than the non-volatile memory may be adopted.

For example, the drive frequency of the drive circuit 30 is measured in the module inspection of the physical quantity detection device in which the physical quantity transducer 18 and the circuit device are housed in the package. A frequency adjustment value for adjusting the oscillation frequency of the oscillation circuit 190 to a frequency keeping out of an interference frequency described later is obtained, and is stored in the storage unit 130. In this case, even in a case where the supply of power to the physical quantity detection device is stopped when the storage unit 130 is constituted by the non-volatile memory, information of the frequency adjustment value is held in the storage unit 130. At the time of the next power activation, this frequency adjustment value is read out from the storage unit 130, and thus it is possible to realize the adjustment of the oscillation frequency by the second frequency adjustment unit 192.

Figure 3:
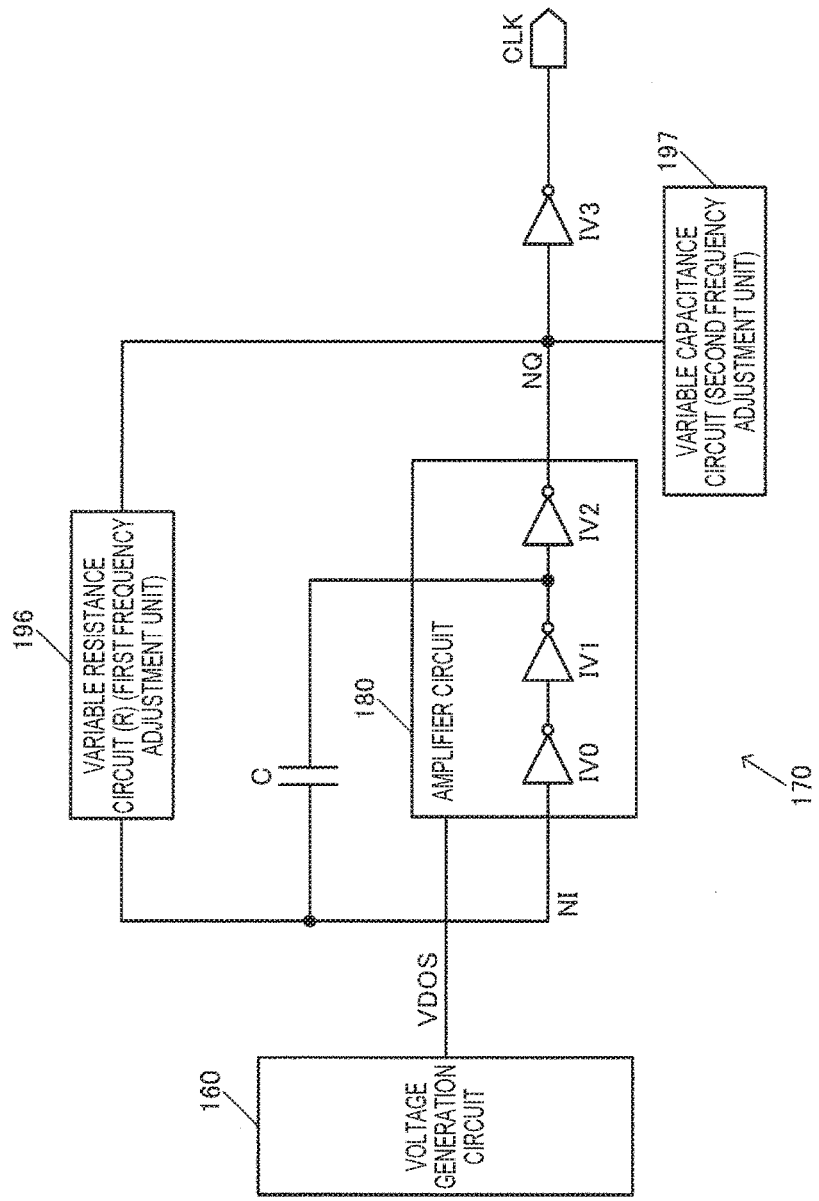
FIG. 3 is a configuration example of a clock signal generation circuit.

FIG. 3 illustrates a configuration example of the clock signal generation circuit 150. In FIG. 3, the oscillation circuit 190 of FIGS. 1 and 2 is realized by a CR oscillation circuit 170. Meanwhile, the clock signal generation circuit 150 is not limited to the configuration of FIG. 3, and various modifications such as omissions of some of the components or additions of other components can be made.

A voltage generation circuit 160 generates a power supply voltage VDOS, and supplies the generated voltage to the CR oscillation circuit 170. For example, a power supply voltage VDOS based on a work function difference described later is generated and supplied.

The CR oscillation circuit 170 includes a capacitor C, a variable resistance circuit 196, a variable capacitance circuit 197, and an amplifier circuit 180 (buffer circuit). The CR oscillation circuit 170 operates by the power supply voltage VDOS being supplied, and generates a clock signal CLK (oscillation signal). Specifically, the CR oscillation circuit 170 generates an oscillation signal by feeding back a signal to an input, using an RC circuit constituted by a capacitor and a resistor. A signal obtained by shaping the waveform of the generated oscillation signal is output as the clock signal CLK.

The amplifier circuit 180 (inversion amplifier circuit) includes inverter circuits IV0, IV1, and IV2. The output of the inverter circuit IV1 is fed back to the input node NI of the amplifier circuit 180 through the capacitor C. The output of the inverter circuit IV2 is fed back to the input node NI of the amplifier circuit 180 through the variable resistance circuit 196(R). The input of the inverter circuit IV0 serves as the input of the amplifier circuit 180.

An oscillation signal which is output from the inverter circuit IV2 is subject to waveform shaping through the inverter circuit IV3, and is output as the clock signal CLK of a square wave. For example, the rising edge and the falling edge of the oscillation signal are formed in an obtuse waveform. The inverter circuit IV3 shapes the waveform of the oscillation signal having such a waveform to a square wave of which the rising edge and the falling edge are steep. Meanwhile, a divider circuit may be provided to the subsequent stage of the inverter circuit IV3, and one or a plurality of clock signals obtained by frequency-dividing the clock signal CLK may be output.

In this manner, in FIG. 3, the oscillation circuit 190 of FIGS. 1 and 2 is realized by the CR oscillation circuit 170. The first frequency adjustment unit 191 of FIGS. 1 and 2 is realized by the variable resistance circuit 196 of the CR oscillation circuit 170. In addition, the CR oscillation circuit 170 includes the amplifier circuit 180, and the variable resistance circuit 196 serves as a resistance circuit that feeds back the signal of the amplifier circuit 180 to the input node NI of the amplifier circuit 180.

In addition, in FIG. 3, the second frequency adjustment unit 192 of FIGS. 1 and 2 is realized by the variable capacitance circuit 197 of the CR oscillation circuit 170. In addition, the CR oscillation circuit 170 includes the amplifier circuit 180, and the variable capacitance circuit 197 is provided to the output node NQ of the amplifier circuit 180. That is, one end of the capacitor of the variable capacitance circuit 197 is connected to the output node NQ of the amplifier circuit 180.

Meanwhile, the connection configuration of the variable resistance circuit 196 or the variable capacitance circuit 197 is not limited to that in FIG. 3, and various modifications can be made. For example, in FIG. 3, the output of the inverter circuit IV2 located at the final stage of the amplifier circuit 180 is fed back to the input node NI of the amplifier circuit 180 through the variable resistance circuit 196. However, for example, the output of the inverter circuit IV0 located at a first stage of the amplifier circuit 180 may be fed back to the input node NI of the amplifier circuit 180 through the variable resistance circuit 196. In addition, the connection position of the variable capacitance circuit 197 is also not limited to the position in FIG. 3, and various modifications can be made when a connection configuration capable of changing the capacitance value of the RC circuit is used.

In FIG. 3, before the physical quantity transducer 18 and the circuit device are connected to each other, the oscillation frequency of the CR oscillation circuit 170 is adjusted by the variable resistance circuit 196 which is the first frequency adjustment unit 191. That is, the variable resistance circuit 196 is a circuit capable of variably adjusting the resistance value thereof. The resistance value of the RC circuit is changed by changing the resistance value of the variable resistance circuit 196, and thus the oscillation frequency of the CR oscillation circuit 170 is adjusted.

On the other hand, in a state where the physical quantity transducer 18 and the circuit device are connected to each other, the oscillation frequency of the CR oscillation circuit 170 is adjusted by the variable capacitance circuit 197 which is the second frequency adjustment unit 192. That is, the variable capacitance circuit 197 is a circuit capable of variably adjusting the capacitance value thereof. The capacitance value of the RC circuit is changed by changing the capacitance value of the variable capacitance circuit 197, and thus the oscillation frequency of the oscillation circuit 170 is adjusted.

In this manner, in the present embodiment, it is possible to realize the first frequency adjustment (coarse adjustment) of the oscillation frequency in a state before the physical quantity transducer 18 and the circuit device are connected to each other, and the second frequency adjustment (fine adjustment) of the oscillation frequency in a state where the physical quantity transducer 18 and the circuit device are connected to each other.

For example, in the circuit device so far that detects a physical quantity through the physical quantity transducer 18, there is the possibility of detection performance deteriorating due to interference caused by the drive frequency of the physical quantity transducer 18 in the circuit included in the detection circuit 60. That is, the detection circuit 60 includes the A/D conversion circuit 100 and the DSP unit 110 which are circuits operating through a signal (sampling clock signal, or operation clock signal) based on the clock signal generated by the clock signal generation circuit 150. The interference caused by the drive frequency of the physical quantity transducer 18 influences the detection circuit 60 including these circuits, and thus there is the possibility of a deterioration or the like in the detection performance of the detection circuit 60 occurring in the detection circuit. For example, when the physical quantity transducer 18 is connected to the circuit device, the detection performance of the detection circuit 60 may deteriorate due to interference between a drive frequency component of the drive circuit 30 and an operating frequency of the detection circuit 60.

In this regard, according to the present embodiment, even after the physical quantity transducer 18 and the circuit device are connected to each other, the second frequency adjustment of the oscillation frequency by the second frequency adjustment unit 192 can be made. Therefore, the oscillation frequency of the oscillation circuit 190 is finely adjusted by the second frequency adjustment, and thus it is possible to reduce a deterioration in the detection performance of the detection circuit 60 due to the interference caused by the drive frequency of the physical quantity transducer 18.

For example, when a drive frequency component is wrapped around the detection circuit 60 side, there is the possibility of a problem of an interference frequency occurring in which the drive frequency component and the frequency component of an operation signal (such as a sampling clock signal) based on the clock signal are coincident with each other. When such a problem of the interference frequency occurs, a variation or the like in the detection value of the detection circuit 60 is generated, and thus detection performance deteriorates.

According to the present embodiment, even in such a case, it is possible to set the oscillation frequency to a frequency keeping out of the interference frequency through the second frequency adjustment based on the second frequency adjustment unit 192, and to reduce a deterioration in detection performance as described above.

Particularly, when the physical quantity transducer 18 is driven by the drive circuit 30, a variation also occurs in the drive frequency due to the element variation of the physical quantity transducer 18. For this reason, a fluctuation due to a variation also occurs in the interference frequency based on the drive frequency component. In addition, the oscillation frequency of the oscillation circuit 190 also fluctuates due to a temperature change. Even when the drive frequency or the oscillation frequency fluctuates in this manner, according to the present embodiment, the second frequency adjustment which is a fine adjustment is performed after the first frequency adjustment which is a coarse adjustment, and thus there is an advantage that the setting of the oscillation frequency to a frequency keeping out of the interference frequency is facilitated.

In addition, in the present embodiment, the clock signal generation circuit 150 including the oscillation circuit 190 is provided in the circuit device, and the A/D conversion circuit 100 and the DSP unit 110 of the detection circuit 60 are operated by the operation signal based on the generated clock signal. Therefore, it is possible to realize the high-speed operation of the circuit, as compared to a case where these circuits are operated by a signal based on the drive signal of the drive circuit 30.

That is, in the related art, since the circuit of the detection circuit 60 is operated by the signal based on the drive signal of the drive circuit 30, and the frequency of the drive signal is not very high (for example, 50 to 150 KHz), it is not possible to realize the high-speed operation of the circuit. For example, it is not possible to realize the high-speed A/D conversion operation of the A/D conversion circuit 100 and high-speed digital signal processing of the DSP unit 110.

In this regard, in the present embodiment, a high-speed original oscillation clock such as, for example, 5 MHz or higher is generated by the oscillation circuit 190 of the clock signal generation circuit 150, and thus the A/D conversion circuit 100 and the DSP unit 110 can be operated using the sampling clock signal and the operation clock signal obtained by frequency-dividing this original oscillation clock. Therefore, it is possible to terminate a process in each of these circuits at high speed, to realize a process which is not capable of being realized by the signal based on the drive signal, or the like.

In order to speed up such a circuit operation, when the circuit of the detection circuit 60 is operated by the operation signal based on the clock signal of the clock signal generation circuit 150, there is the possibility of the occurrence of a problem which is not generated when the circuit of the detection circuit 60 is operated by the signal based on the drive signal. For example, as described later in detail, a problem of interference between the frequency component of the drive signal and the frequency component of the operation signal such as a sampling clock signal occurs, and a problem such as a deterioration in the detection performance of the detection circuit 60 is caused.

In this regard, in the present embodiment, the second frequency adjustment after connection between the physical quantity transducer 18 and the circuit device can be performed in addition to the first frequency adjustment before connection between the physical quantity transducer 18 and the circuit device. Therefore, even when there is the possibility of detection performance deteriorating due to an influence caused by the connection between the physical quantity transducer 18 and the circuit device, it is possible to avoid such a problem through the second frequency adjustment of the oscillation frequency. Therefore, it is also possible to reduce an influence of a deterioration in detection performance on the circuit of the detection circuit 60 which is caused by the connection between the physical quantity transducer 18 and the circuit device, while realizing the high-speed operation of the circuit of the detection circuit 60.

2. Detailed Configurations of Electronic Apparatus, Gyro Sensor, and Circuit Device FIG. 4 illustrates a detailed configuration example of a circuit device 20 of the present embodiment, a gyro sensor 510 (quantity detection device in a broad sense physical) including the circuit device 20, and an electronic apparatus 500 including the gyro sensor 510.

Figure 4:
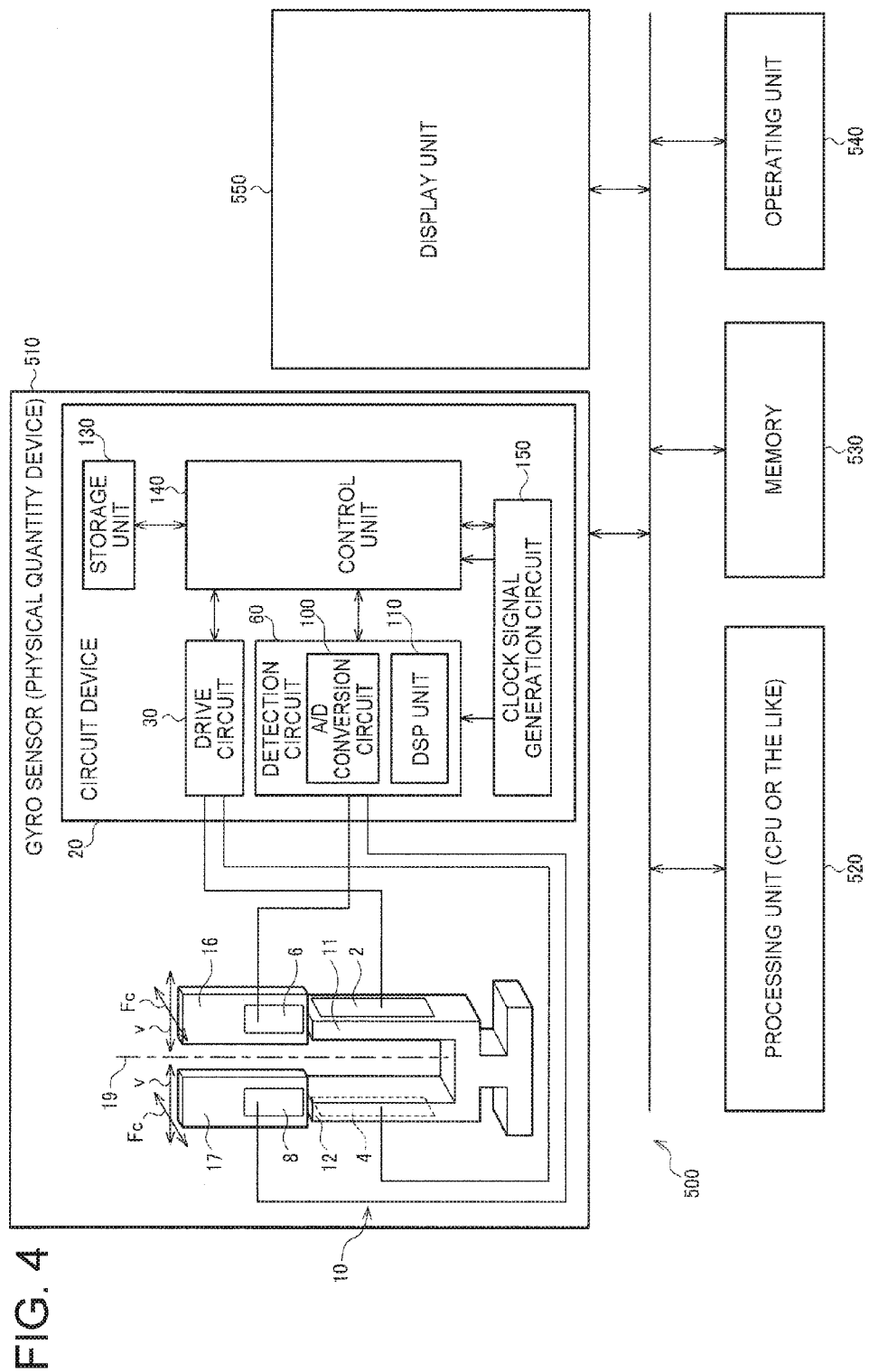
FIG. 4 is a configuration example of the circuit device, an electronic apparatus, and a gyro sensor (physical quantity detection device) of the present embodiment.

Meanwhile, the circuit device 20, the electronic apparatus 500, and the gyro sensor 510 are not limited to the configuration of FIG. 4, and various modifications such as omissions of some of the components or additions of other components can be made. In addition, as the electronic apparatus 500 of the present embodiment, it is possible to assume various apparatuses such as a digital camera, a video camera, a smartphone, a cellular phone, a car navigation system, a robot, a game console, a timepiece, health appliances, and a portable information terminal. In addition, hereinafter, a case where the physical quantity transducer is a piezoelectric vibrator element (vibration gyro) and the sensor is a gyro sensor will be described by way of example, but the invention is not limited thereto. For example, the invention can also be applied to a capacitance detection type vibration gyro formed of a silicon substrate or the like, a physical quantity transducer that detects a physical quantity equivalent to angular velocity information or physical quantities other than the angular velocity information, and the like.

The electronic apparatus 500 includes the gyro sensor 510 and a processing unit 520. In addition, the apparatus can include a memory 530, an operating unit 540, and a display unit 550. The processing unit 520 (CPU, MPU or the like) performs control of the gyro sensor 510 or the like or control of the entire electronic apparatus 500. In addition, the processing unit 520 performs processing on the basis of angular velocity information (physical quantity in a broad sense) detected by the gyro sensor 510. For example, processing for shake correction, posture control, GPS autonomous navigation, or the like is performed on the basis of the angular velocity information. The memory 530 (ROM, RAM or the like) stores control programs and various types of data, or functions as a work area and a data storage area. The operating unit 540 is used for a user's operation of the electronic apparatus 500, and the display unit 550 displays various information to a user.

The gyro sensor 510 (physical quantity detection device) includes a vibrator element 10 and the circuit device 20. The vibrator element 10 (physical quantity transducer in a broad sense) of FIG. 4 is a tuning fork type piezoelectric vibrator element which is formed of a thin plate of a piezoelectric material such as quartz crystal, and includes drive vibrator elements 11 and 12 and detecting vibrator elements 16 and 17. The drive vibrator elements 11 and 12 are provided with drive terminals 2 and 4, and the detecting vibrator elements 16 and 17 are provided with detection terminals 6 and 8.

The circuit device 20 includes the drive circuit 30, the detection circuit 60, the storage unit 130, a control unit 140, and the clock signal generation circuit 150. Meanwhile, various modifications such as omissions of some of these components or additions of other components can be made.

The drive circuit 30 outputs a drive signal (drive voltage) to drive the vibrator element 10. The circuit receives a feedback signal from the vibrator element 10, to thereby excite the vibrator element 10. The detection circuit 60 receives a detection signal (detection current, charge) from the vibrator element 10 which is driven by a drive signal, and detects (extracts) a desired signal (physical quantity signal, Coriolis force signal) based on a physical quantity applied to the vibrator element 10, from the detection signal.

Specifically, an alternating drive signal (drive voltage) from the drive circuit 30 is applied to the drive terminal 2 of the drive vibrator element 11. Then, the drive vibrator element 11 starts to vibrate due to the inverse piezoelectric effect, and the drive vibrator element 12 also starts to vibrate due to a tuning fork vibration. In this case, a current (charge) which is generated by the piezoelectric effect of the drive vibrator element 12 is fed back from the drive terminal 4 to the drive circuit 30, as a feedback signal. Thereby, an oscillation loop including the vibrator element 10 is formed.

When the drive vibrator elements 11 and 12 vibrate, the detecting vibrator elements 16 and 17 vibrate at vibration velocity v in a direction shown in FIG. 4. Then, a current (charge) which is generated by the piezoelectric effect of the detecting vibrator elements 16 and 17 is output from the detection terminals 6 and 8 as detection signals (first and second detection signals). Then, the detection circuit 60 receives a detection signal from the vibrator element 10, and detect a desired signal (desired wave) which is a signal corresponding to a Coriolis force. That is, when the vibrator element 10 (gyro sensor) rotates around a detection axis 19, a Coriolis force Fc is generated in a direction perpendicular to the vibration direction of the vibration velocity v. For example, when an angular velocity during the rotation thereof around the detection axis 19 is set to $\omega$, the mass of the vibrator element is set to m, and the vibration velocity of the vibrator element is set to v, the Coriolis force is expressed as $Fc=2m \cdot v \cdot \omega$. Therefore, the detection circuit 60 detects a desired signal which is a signal according to the Coriolis force, and thus the rotational angular velocity $\omega$ of the gyro sensor can be obtained. By using the obtained angular velocity $\omega$, the processing unit 520 can perform a variety of processing such as shaking correction, posture control, or GPS autonomous navigation.

The control unit 140 performs various types of control process on the basis of the clock signal from the clock signal generation circuit 150. For example, the drive circuit 30 and the detection circuit 60 are controlled on the basis of the clock signal (signal obtained by frequency-dividing the clock signal).

In addition, the control unit 140 also performs a process (process of storing) of writing a frequency adjustment value in the storage unit 130, or a process of reading out the frequency adjustment value from the storage unit 130.

The clock signal generation circuit 150 is set to be in an operation enable state by power-on reset release, and supplies the clock signal to the control unit 140. The control unit 140 starting an operation through the supply of the clock signal starts up the drive circuit 30 and the detection circuit 60, and starts operations of these circuits.

The detection circuit 60 includes the A/D conversion circuit 100 and the DSP unit 110. The A/D conversion circuit 100 performs a sampling operation of an input signal through the sampling clock signal based on the clock signal from the clock signal generation circuit 150, and executes A/D conversion. For example, an analog detection signal (desired signal) is converted into a digital signal (digital data). The DSP unit 110 receives the digital signal from the A/D conversion circuit 100, and performs digital signal processing on the digital signal. The digital signal processing (DSP) unit 110 operates through the operation clock signal based on the clock signal from the clock signal generation circuit 150, and executes various types of digital signal processing such as filter processing.

Meanwhile, FIG. 4 illustrates an example when the vibrator element 10 is a tuning fork type, but the vibrator element 10 of the present embodiment is not limited to such a structure. For example, the vibrator may be a T shape, a double T shape, or the like. In addition, the piezoelectric material of the vibrator element 10 may be a material except for quartz crystal.

Figure 5:
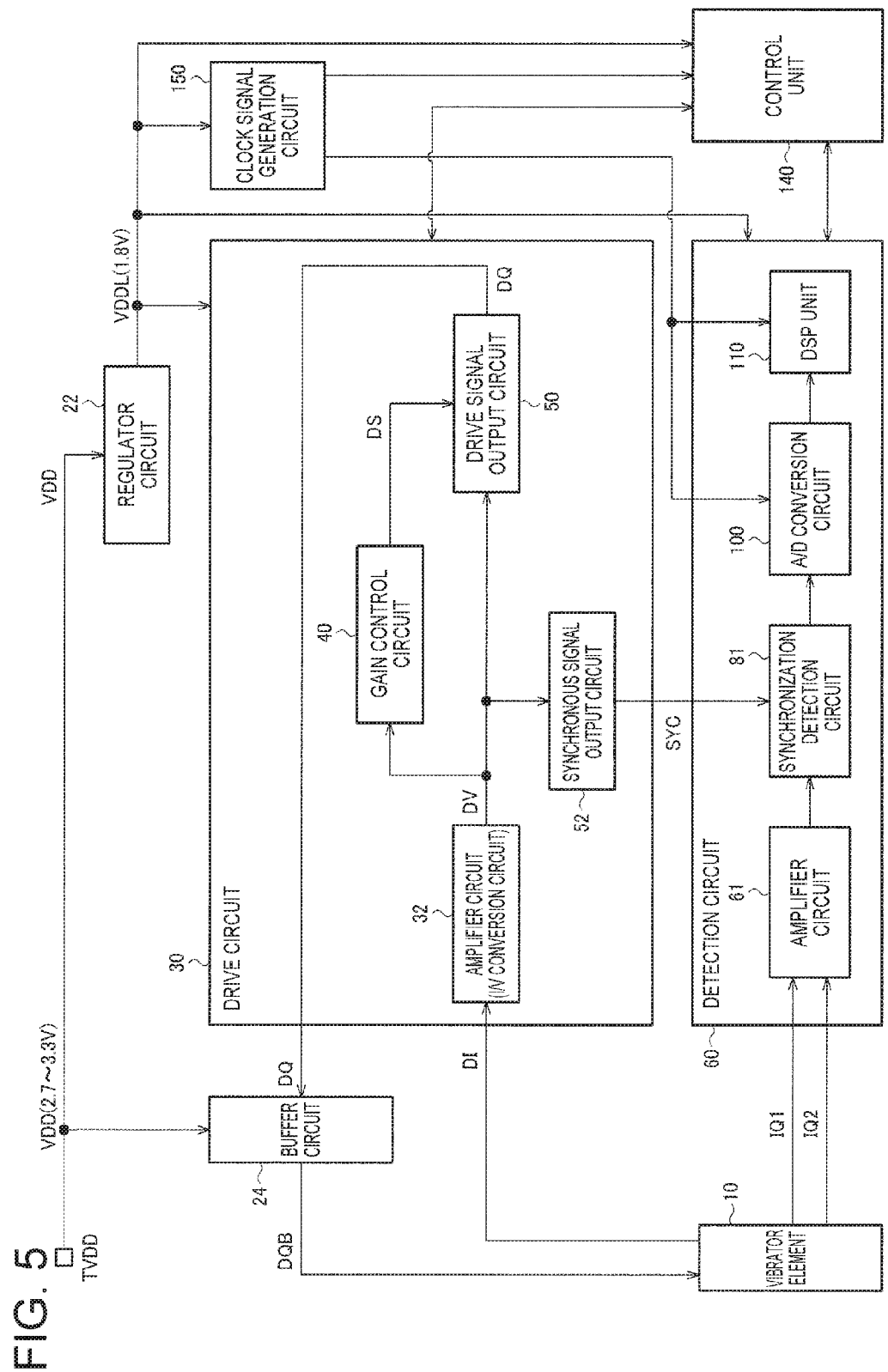
FIG. 5 is a detailed configuration example of the circuit device of the present embodiment.

FIG. 5 illustrates a further detailed configuration example of the circuit device 20 of the present embodiment. The circuit device 20 includes the drive circuit 30 that drives the vibrator element 10 by receiving the feedback signal DI from the vibrator element 10 (physical quantity transducer) and the detection circuit 60 that detects a desired signal by receiving detection signals IQ1 and IQ2 from the vibrator element 10. In addition, the circuit device 20 includes the control unit 140 and the clock signal generation circuit 150. The circuit device can further include a power supply terminal TVDD to which a power supply voltage VDD is input, a regulator circuit 22, and a buffer circuit 24.

The external power supply voltage VDD, for example, is input to the power supply terminal TVDD. The power supply voltage VDD is supplied to the regulator circuit 22 or the buffer circuit 24. The power supply terminal TVDD is, for example, a pad in the circuit device (IC chip).

The regulator circuit 22 performs a voltage adjustment for dropping the power supply voltage VDD which is supplied from the power supply terminal TVDD. A regulator power supply voltage VDDL obtained by the voltage adjustment is supplied to the drive circuit 30 and the detection circuit 60 as an operating power supply voltage. In addition, the regulator circuit 22 supplies the regulator power supply voltage VDDL to the control unit 140 and the clock signal generation circuit 150. For example, when a voltage of 2.7 V to 3.3 V is supplied as power supply voltage VDD from the outside, the regulator circuit 22 performs the voltage adjustment for dropping the power supply voltage VDD, and supplies the regulator power supply voltage VDDL which is a constant voltage of, for example, 1.8 V to the drive circuit 30, the detection circuit 60, the control unit 140, and the clock signal generation circuit 150.

The voltage generation circuit 160 of the clock signal generation circuit 150 shown in FIG. 3 generates a power supply voltage VDOS on the basis of the regulator power supply voltage VDDL. For example, a power supply voltage VDOS obtained by further dropping the regulator power supply voltage VDDL is generated.

The power supply voltage VDD is supplied to the buffer circuit 24. The power supply voltage VDD is used as the power supply voltage of the buffer circuit 24 on the high-potential side. The buffer circuit 24 receives a drive signal DQ from the drive circuit 30, and outputs a high-amplitude drive signal (amplified drive signal) DQB obtained by increasing the amplitude of the drive signal DQ to the vibrator element 10 (physical quantity transducer). For example, when the amplitude of the drive signal DQ is set to a first amplitude, a drive signal DQB having a second amplitude larger than the first amplitude is output to the vibrator element 10. In this case, the drive signals DQ and DQB may be signals of a square wave, and may be signals of a sinusoidal wave.

The drive circuit 30 includes an amplifier circuit 32 to which a feedback signal DI from the vibrator element 10 is input, a gain control circuit 40 that performs automatic gain control, and a drive signal output circuit 50 that outputs the drive signal DQ to the vibrator element 10. In addition, the circuit includes a synchronous signal output circuit 52 that outputs a synchronous signal SYC to the detection circuit 60. Meanwhile, the configuration of the drive circuit 30 is not limited to FIG. 5, and various modifications such as omissions of some of these components or additions of other components can be made.

The amplifier circuit 32 (I/V conversion circuit) amplifies the feedback signal DI from the vibrator element 10. For example, the signal DI of a current from the vibrator element 10 is converted into a signal DV of a voltage and outputs the converted signal. The amplifier circuit 32 can be realized by a capacitor, a resistive element, an operational amplifier, or the like.

The drive signal output circuit 50 outputs the drive signal DQ on the basis of the signal DV after the amplification of the amplifier circuit 32. For example, when the drive signal output circuit 50 outputs a drive signal of a square wave (or sinusoidal wave), the drive signal output circuit 50 can be realized by a comparator or the like.

The gain control circuit 40 (AGC) outputs a control voltage DS to the drive signal output circuit 50, and controls the amplitude of the drive signal DQ. Specifically, the gain control circuit 40 monitors the signal DV, and controls a gain of an oscillation loop. For example, in the drive circuit 30, in order to keep the sensitivity of the gyro sensor constant, the amplitude of a drive voltage which is supplied to the vibrator element 10 (drive vibrator element) is required to be kept constant. For this reason, the gain control circuit 40 for automatically adjusting a gain is provided within the oscillation loop of a drive vibration system. The gain control circuit 40 adjusts a gain variably and automatically so that the amplitude (vibration velocity v of the vibrator element) of the feedback signal DI from the vibrator element 10 becomes constant. The gain control circuit 40 is realized by a full-wave rectifier that performs full-wave rectification on the output signal DV of the amplifier circuit 32, an integrator that performs an integration process on the output signal of the full-wave rectifier.

The synchronous signal output circuit 52 receives the signal DV after the amplification of the amplifier circuit 32, and outputs a synchronous signal SYC (reference signal) to the detection circuit 60. The synchronous signal output circuit 52 can be realized by a comparator that generates the synchronous signal SYC of a square wave by performing binary coded processing on the signal DV of a sinusoidal wave (alternating current), a phase adjustment circuit (phase shifter) that performs phase adjustment on the synchronous signal SYC, or the like.

The detection circuit 60 includes an amplifier circuit 61, a synchronization detection circuit 81, the A/D conversion circuit 100, and the DSP unit 110. The amplifier circuit 61 receives the first and second detection signals IQ1 and IQ2 from the vibrator element 10, and performs differential signal amplification or charge-voltage conversion. The synchronization detection circuit 81 performs synchronous detection on the basis of the synchronizing signal SYC from the drive circuit 30. The A/D conversion circuit 100 performs A/D conversion of a signal after the synchronous detection. The DSP unit 110 performs digital signal processing such as digital filter processing or digital correction processing on the digital signal from the A/D conversion circuit 100.

The control unit 140 performs a control process of the circuit device 20. The control unit 140 can be realized by a logic circuit (such as a gate array), a processor, or the like. Various types of switch control, mode setting, or the like in the circuit device 20 is performed by the control unit 140.

3. Interference Frequency

In the circuit device that drives the vibrator element 10 to detect a physical quantity such as an angular velocity, there is the possibility of detection performance deteriorating due to interference between the drive frequency of the vibrator element 10 and the sampling clock signal (operation signal) or the like of the A/D conversion circuit 100 of the detection circuit 60. For example, in the interference frequency in which the drive frequency component and the sampling frequency component of the A/D conversion circuit 100 are coincident with each other, a variation or the like of an angular velocity code is generated, and the detection performance deteriorates.

Meanwhile, in the present embodiment, a fundamental mode component (fundamental frequency component) and a harmonic component (harmonic frequency component) of the drive frequency are called a drive frequency component, and a fundamental frequency component and a harmonic frequency component of the sampling frequency of the A/D conversion circuit 100 are called a sampling frequency component.

Figure 6:
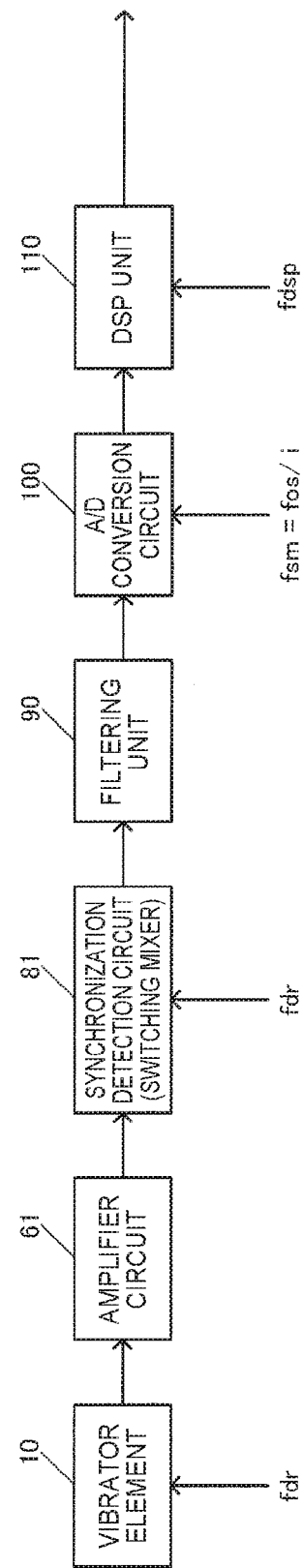
FIG. 6 is a diagram illustrating an operation of a detection circuit according to an operation signal based on a clock signal.

FIG. 6 is a diagram illustrating a sampling clock signal of the A/D conversion circuit 100 and an operation clock signal of the DSP unit 110 which are supplied to the detection circuit 60.

As shown in FIG. 6, the vibrator element 10 is driven at a drive frequency fdr. In addition, the synchronization detection circuit 81 performs a synchronous detection process on the basis of the synchronizing signal of the drive frequency fdr. The drive frequency fdr includes a variation due to an individual difference of the vibrator element 10.

Here, as a method of a comparative example of the present embodiment, a method is also considered in which the A/D conversion circuit 100, the DSP unit 110, or the like of the detection circuit 60 is operated by a signal based on the drive signal of the drive frequency fdr. However, in the method of the comparative example, when the drive frequency fdr is, for example, approximately 100 KHz, the signal based on the drive signal is set to be equal to or lower than 100 KHz, and thus it is not possible to realize the high-speed operation of the A/D conversion circuit 100 or the DSP unit 110.

For this reason, in the present embodiment, the clock signal generation circuit 150 including the oscillation circuit 190 is provided, and a method is adopted in which the A/D conversion circuit 100, the DSP unit 110, or the like is operated by the operation signal based on the generated clock signal. For example, in FIG. 6, the clock signal of an oscillation frequency fos is frequency-divided by i, and the A/D conversion circuit 100 is operated on the basis of the sampling clock signal of a sampling frequency fsm=fos/i obtained by frequency division. In addition, the DSP unit 110 is operated on the basis of the operation clock signal of a clock frequency fdsp obtained by frequency-dividing the clock signal of the oscillation frequency fos.

In such a circuit device of the present embodiment, there is the possibility of the occurrence of a problem of a variation in the angular velocity code caused by interference with the frequency of the drive signal.

Figure 7:
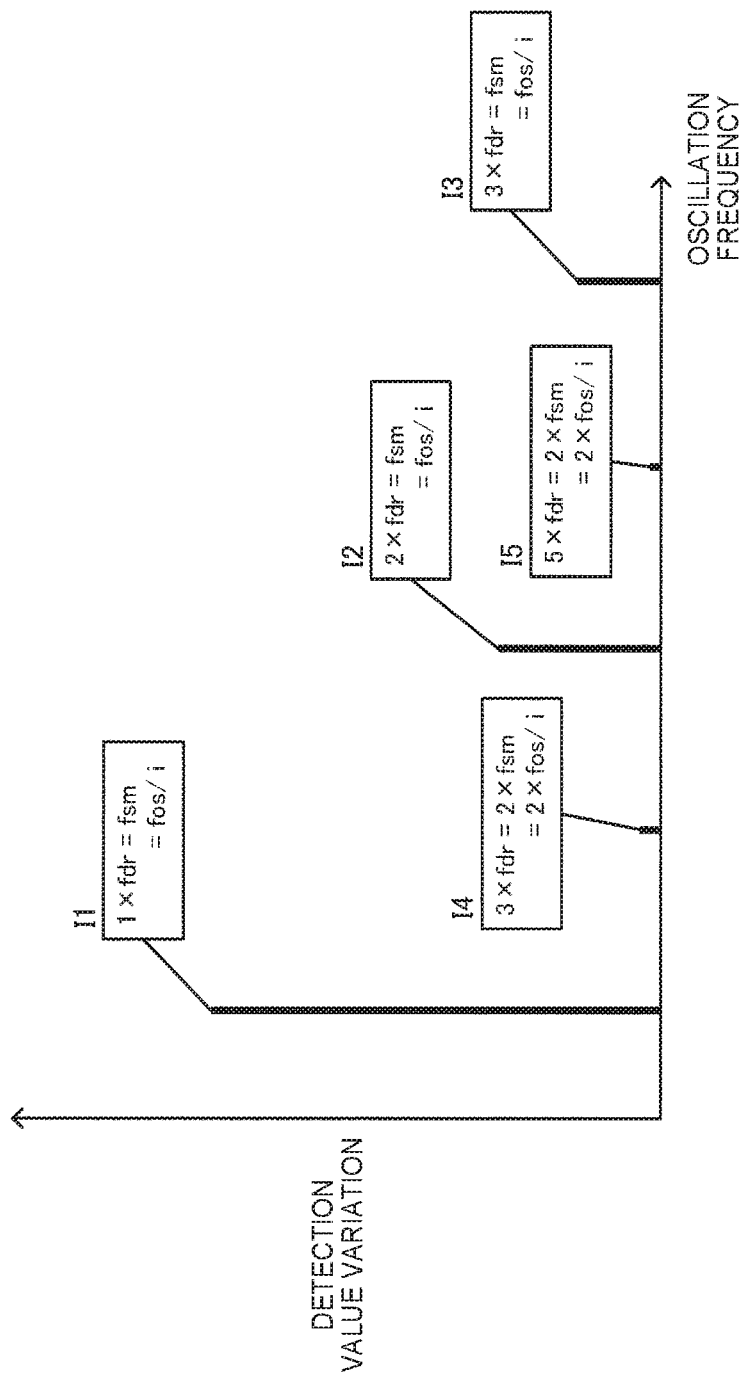
FIG. 7 is a diagram illustrating interference frequencies.

FIG. 7 is a diagram illustrating an interference frequency. The horizontal axis of FIG. 7 represents an oscillation frequency, and the vertical axis represents the amplitude of an angular velocity code variation. A problem of an angular velocity code variation caused by interference between the drive frequency component and the operating frequency on the detection circuit 60 side occurs.

For example, the oscillation frequency of the oscillation circuit 190 is set to fos, i, j, and k are set to an integer of 1 or greater, and the frequency of the operation signal such as the sampling clock signal is set to fos/i. When i≥2, i is equivalent to the division ratio of the clock signal, and fos/i is set to the frequency of the operation signal such as the sampling clock signal frequency-divided by a division ratio i.

In this case, the interference frequency is an oscillation frequency when the relation of j×fdr=k×fos/i is established. That is, when the interference frequency is set to fin, the relational expression of j×fdr=k×fos/i is established in a case of fos=fin.

For example, in the interference frequency shown in I1 of FIG. 7, the relation of 1×fdr=fsm=fos/i is established. For example, when the interference frequency of I1 is set to fos=fin1, the relation of 1×fdr=fos/i=fin1/i is established. This is equivalent to a case of j=1 and k=1 in the relational expression (interference condition) of j×fdr=k×fos/i.

In addition, in the interference frequency shown in I2, the relation of 2×fdr=fsm=fos/i is established. For example, when the interference frequency shown in I2 is set to fos=fin2, the relation of 2×fdr=fos/i=fin2/i is established. This is equivalent to a case of j=2 and k=1 in the relational expression of j×fdr=k×fos/i.

In addition, in the interference frequency shown in I3, the relation of 3×fdr=fsm=fos/i is established. For example, when the interference frequency shown in I3 is set to fos=fin3, the relation of 3×fdr=fos/i=fin3/i is established. This is equivalent to a case of j=3 and k=1 in the relational expression of j×fdr=k×fos/i.

In the interference frequency shown in I4, the relation of 3×fdr=2×fsm=2×fos/i is established. For example, when the interference frequency shown in I4 is set to fos=fin4, the relation of 3×fdr=2×fos/i=2×fin4/i is established. This is equivalent to a case of j=3 and k=2 in the relational expression of j×fdr=k×fos/i.

In the interference frequency shown in I5, the relation of 5×fdr=2×fsm=2×fos/i is established. For example, when the interference frequency shown in I5 is set to fos=fin5, the relation of 5×fdr=2×fos/i=2×fin5/i is established. This is equivalent to a case of j=5 and k=2 in the relational expression of j×fdr=k×fos/i.

In this manner, an interference condition represented by the relational expression of j×fdr=k×fsm=k×fos/i is established at the interference frequency. Here, j×fdr is equivalent to the harmonic component (j≥2) or the fundamental mode component (j=1) of the drive frequency fdr. In addition, fsm=fos/i is equivalent to the sampling frequency (frequency of operation signal in a broad sense) of the A/D conversion circuit 100. Therefore, j×fdr=k×fos/i which is an interference condition corresponds to a condition in which the harmonic component (j≥2) or the fundamental mode component (j=1) of the drive frequency fdr is coincident with k times the sampling frequency fos/i.

Meanwhile, the angular velocity code variation at the interference frequency shown in FIG. 7 is generated by the cause of the frequency component (drive frequency component) of an undesired signal mixed into the input signal of the A/D conversion circuit 100 folded back in a signal band due to the sampling operation of the A/D conversion circuit 100. Therefore, the angular velocity code variation at the interference frequency appears conspicuously, in reality, when a frequency difference $\Delta f$ between $j \times fdr$ and $k \times fsm$ is sufficiently small, rather than when $j \times fdr$ and $k \times fsm$ are completely coincident with each other. Specifically, when the frequency difference $\Delta f$ is lower than the frequency (for example, 200 Hz to 10 Hz) of the signal band which is a frequency band of the desired signal, aliasing noise due to the frequency difference $\Delta f$ appears in the signal band, and thus a problem of the angular velocity code variation (swing) occurs. When the frequency difference $\Delta f$ is large, aliasing noise is sufficiently reduced by a low-pass filter for bandwidth limitation of the DSP unit 110, and thus the angular velocity code variation is not also generated. In this manner, the interference frequency to be avoided in the present embodiment can be said to have a given frequency width (signal bandwidth, $\Delta f$).

In the present embodiment, a method is adopted in which the oscillation frequency of the oscillation circuit 190 is set to a frequency keeping out of such an interference frequency. That is, when the oscillation frequency is set to fos, i and j are set to an integer of 1 or greater, and the frequency of the operation signal is set to fos/i, the oscillation frequency fos is set so that the relation of $j \times fdr \neq fos/i$ is established. The frequency fos/i of the operation signal is a frequency of the sampling clock signal of the A/D conversion circuit 100 or the operation clock signal (output data rate) of the DSP unit 110.

In this manner, when the oscillation frequency fos is set so that the relation of $j \times fdr \neq fos/i$ is established, the oscillation frequency fos can be set to a frequency keeping out of the interference frequencies shown in I1, I2, and I3 of FIG. 7. Therefore, it is possible to reduce the generation of the angular velocity code variation of large values shown in I1, I2, and I3, and to reduce a deterioration in detection performance.

Further, in the present embodiment, when k is set to an integer of 1 or greater, it is preferable to set the oscillation frequency fos so that the relation of $j \times fdr \neq k \times fos/i$ is established. That is, the oscillation frequency fos is set to a frequency keeping out of not only the interference frequencies in a case of k=1 as shown in I1, I2, and I3 of FIG. 7, but also the interference frequencies in a case of k≥2 as shown in I4 and I5. With such a configuration, it is possible to prevent not only the generation of the angular velocity code variation of large values as shown in I1, I2, and I3, but also the generation of the angular velocity code variation of relatively small values as shown in I4 and I5.

In the present embodiment, the adjustment of the oscillation frequency fos having such a relation of $j \times fdr \neq k \times fos/i$ is realized by a frequency adjustment based on the second frequency adjustment unit 192 or the like of FIG. 1. For example, the adjustment is realized by the adjustment or the like of the capacitance value of the variable capacitance circuit 197 of FIG. 3.

For example, in the method of the comparative example in which the circuit of the detection circuit 60 is operated by the signal based on the drive signal, a problem of the interference frequency as shown in FIG. 7 does not occur.

On the other hand, in the present embodiment, in order to realize the high-speed operation of the circuit of the detection circuit 60, the clock signal generation circuit 150 including the oscillation circuit 190 is provided, and the circuit (A/D conversion circuit, or DSP unit) of the detection circuit 60 is operated by the operation signal based on the generated clock signal. The drive frequency of the drive signal and the oscillation frequency of the oscillation circuit 190 are individually independent of each other, and do not have a correlation therebetween. For this reason, the problem of the interference frequency as shown in FIG. 7 occurs. In order to solve such a problem of the interference frequency, a method of adjusting the oscillation frequency as described below is adopted in the present embodiment.

Figure 8:
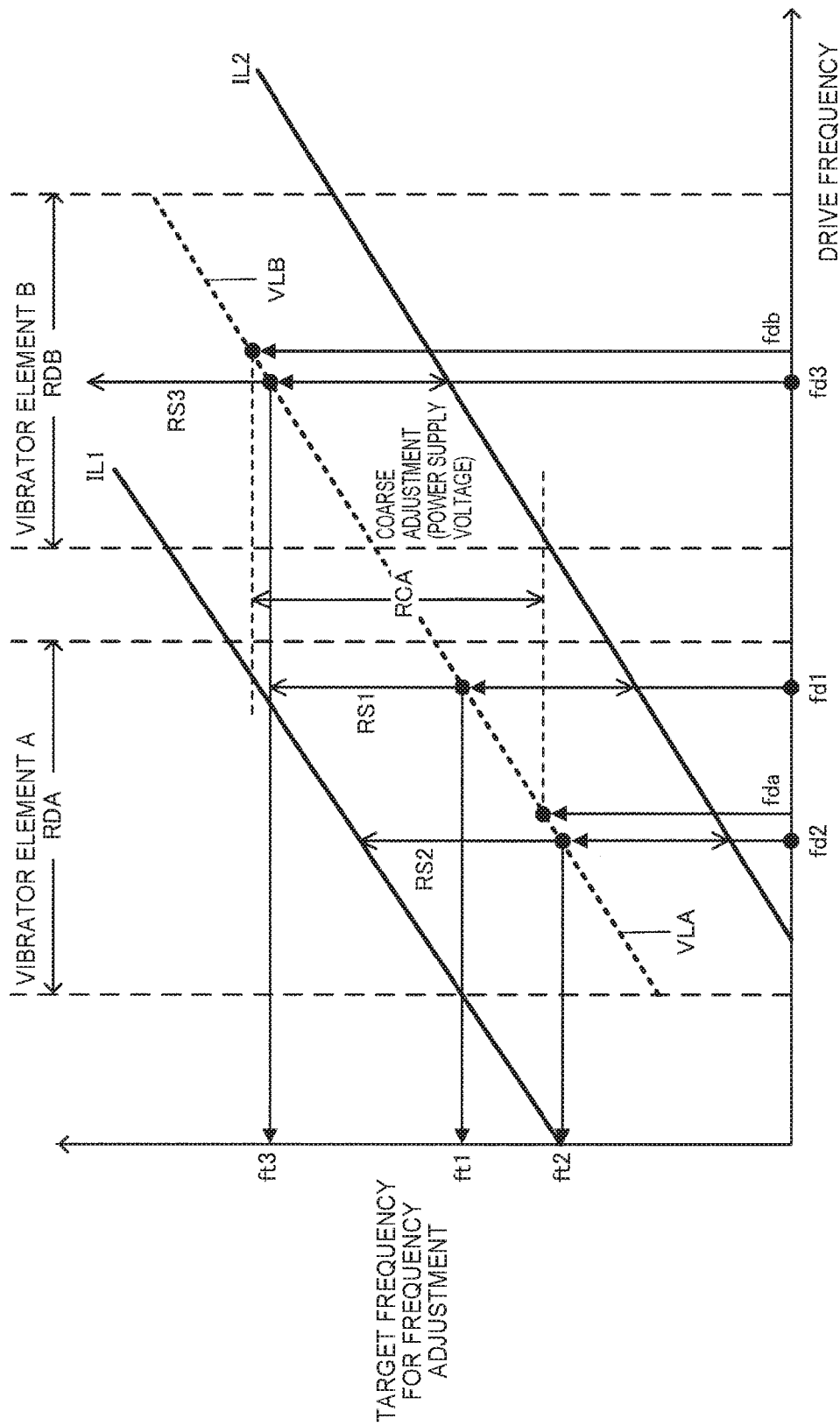
FIG. 8 is a diagram illustrating a method of setting an oscillation frequency to a frequency keeping out of an interference frequency.

FIG. 8 is a diagram illustrating a method of adjusting the oscillation frequency of the present embodiment. In FIG. 8, the horizontal axis is a drive frequency, and the vertical axis is a target oscillation frequency of the frequency adjustment.

In FIG. 8, IL1 and IL2 are lines of the interference frequency described in FIG. 7. On the interference frequency lines IL1 and IL2, the problem of the angular velocity code variation occurs. In addition, in FIG. 8, an example of a vibrator element A and a vibrator element B is shown. In the vibrator element A and the vibrator element B, drive frequencies (typical value) are different from each other. For example, there are two kinds of vibrator elements A and B as vibrator elements which are paired with the circuit device and are incorporated into the package. It is also possible to reduce inter-axial interference in, for example, a multiaxial gyro sensor by using the vibrator elements A and B having different drive frequencies.

As shown in FIG. 8, an individual difference is present in the drive frequencies of the vibrator elements A and B. The drive frequency of the vibrator element A varies in a range of RDA, and the drive frequency of the vibrator element B varies in a range of RDB. The RDA is a variation range of the drive frequency centering on a typical value fda of the drive frequency of the vibrator element A. The RDB is a variation range of the drive frequency centering on a typical value fdb of the drive frequency of the vibrator element B.

The coarse adjustment of the range of the RCA in FIG. 8 is performed depending on which of the vibrator element A and the vibrator element B is connected to the circuit device (depending on whether the physical quantity detection device is constituted by any of the vibrator elements and the circuit device). This coarse adjustment is realized by the voltage adjustment of the power supply voltage VDOS which is supplied by the voltage generation circuit 160 of FIG. 3. In FIG. 8, the coarse adjustment of the oscillation frequency at, for example, 500 KHz/step can be performed by the voltage adjustment of the power supply voltage VDOS.

For example, when a vibrator element which is connected to the circuit device is the vibrator element A (first physical quantity transducer in a broad sense), the voltage generation circuit 160 supplies a first voltage as the power supply voltage VDOS. On the other hand, when a vibrator element which is connected to the circuit device is the vibrator element B (second physical quantity transducer in abroad sense) having a drive frequency different from that of the vibrator element A, the voltage generation circuit 160 supplies a second voltage different from the first voltage as the power supply voltage VDOS.

Specifically, the vibrator element A has a drive frequency lower than that of the vibrator element B. For this reason, when the physical quantity detection device is configured by the vibrator element A being connected to the circuit device, it is preferable that the adjustment range of the oscillation frequency is set to a low-frequency range in response to a low drive frequency of the vibrator element A. Therefore, when the vibrator element A is connected, the voltage generation circuit 160 supplies the first voltage lower than the second voltage, as the power supply voltage VDOS, to the CR oscillation circuit 170 (oscillation circuit 190 in a broad sense). In this manner, the oscillation frequency of the CR oscillation circuit 170 becomes lower, and the adjustment range of the oscillation frequency can be set to a low-frequency range in response to the low drive frequency of the vibrator element A.

On the other hand, the vibrator element B has a drive frequency higher than that of the vibrator element A. For this reason, when the physical quantity detection device is configured by the vibrator element B being connected to the circuit device, it is preferable that the adjustment range of the oscillation frequency is set to a high-frequency range in response to a high drive frequency of the vibrator element B. Therefore, when the vibrator element B is connected, the voltage generation circuit 160 supplies the second voltage higher than the first voltage, as the power supply voltage VDOS, to the CR oscillation circuit 170. In this manner, the oscillation frequency of the CR oscillation circuit 170 becomes higher, and the adjustment range of the oscillation frequency can be set to a high-frequency range in response to the high drive frequency of the vibrator element B.

In addition, in FIG. 8, VLA is an adjustment line of the oscillation frequency in a case of the vibrator element A, and VLB is an adjustment line of the oscillation frequency in a case of the vibrator element B. For example, when the vibrator element A is connected to the circuit device, the oscillation frequency is adjusted using the adjustment line VLA. This adjustment line VLA is a line which is set to be halfway between the interference frequency lines IL1 and IL2.

As shown in the RDA of FIG. 8, a variation due to an individual difference is present in the drive frequency of the vibrator element A. On the other hand, in a packaged state as the physical quantity detection device by the circuit device being connected to the vibrator element A, the drive frequency of the vibrator element A can be uniquely specified by measuring the drive frequency. When the measured drive frequency is fdr=fd1, as shown in FIG. 8, a target oscillation frequency ft1 is obtained from fdr=fd1 and the adjustment line VLA. For example, the target oscillation frequency ft1 can be obtained from a point of intersection between the line of fdr=fd1 and the adjustment line VLA. A frequency adjustment is performed by the second frequency adjustment unit 192 so that the oscillation frequency is set to fos=ft1. Specifically, the capacitance value of the variable capacitance circuit 197 is adjusted so that the oscillation frequency is set to fos=ft1.

In addition, when the measured drive frequency is fdr=fd2, a target oscillation frequency ft2 is obtained from fdr=fd2 and the adjustment line VLA. A frequency adjustment is performed by the second frequency adjustment unit 192 (variable capacitance circuit 197) so that the oscillation frequency is set to fos=ft2.

Similarly, as shown in the RDB of FIG. 8, a variation due to an individual difference is present in the drive frequency of the vibrator element B, but in a state where the circuit device is connected to the vibrator element B, the drive frequency of the vibrator element B can be uniquely specified by measuring the drive frequency. When the measured drive frequency is fdr=fd3, a target oscillation frequency ft3 is obtained from fdr=fd3 and the adjustment line VLB. A frequency adjustment is performed by the second frequency adjustment unit 192 (variable capacitance circuit 197) so that the oscillation frequency is set to fos=ft3.

In this manner, in the present embodiment, the oscillation frequency fos can be set to a frequency keeping out of the interference frequency. That is, the oscillation frequency fos can be set so that the relation of j×fdr≠k×fos/i is established by the frequency adjustment based on the second frequency adjustment unit 192 (variable capacitance circuit 197).

Figure 11:
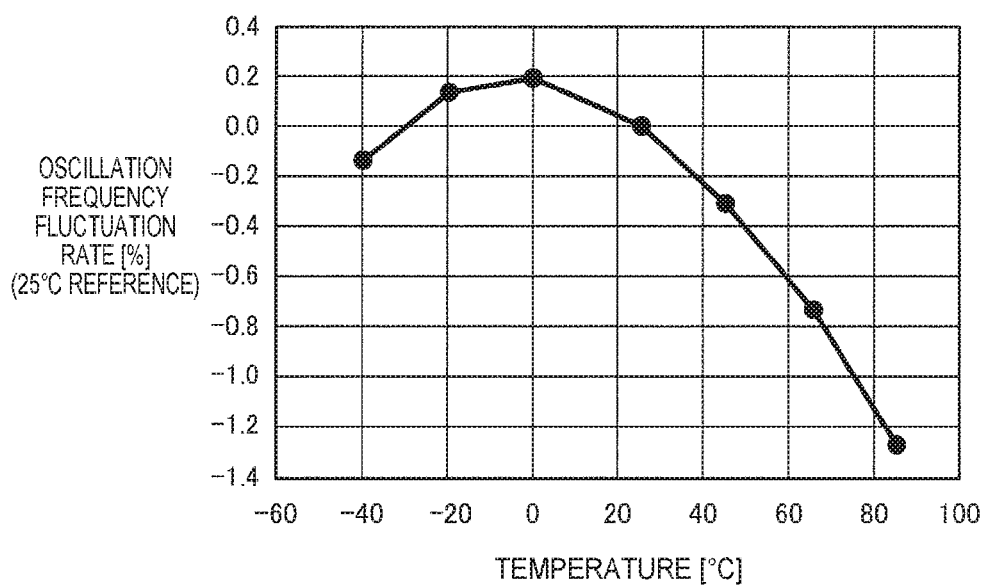
FIG. 11 is a diagram illustrating the temperature characteristics of the fluctuation rate of the oscillation frequency.

As shown in FIG. 8, the adjustment lines VLA and VLB of the oscillation frequency are located halfway between the interference frequency lines IL1 and IL2. Therefore, as shown in FIG. 11 described later, even when the oscillation frequency fluctuates due to a temperature change, it is possible to reduce the generation of the angular velocity code variation due to the interference frequency described in FIG. 7. For example, when a fluctuation in oscillation frequency due to a temperature change falls within a frequency range RS1 in a case where the drive frequency is fdr=fd1, it is possible to avoid interference between the interference frequency lines IL1 and IL2. When a fluctuation in oscillation frequency due to a temperature change falls within a frequency range RS2 in a case where the drive frequency is fdr=fd2, it is possible to avoid interference between the interference frequency lines IL1 and IL2. The same is true of the case of fdr=fd3.

4. Detailed Configuration of Clock Signal Generation Circuit

Figure 9:
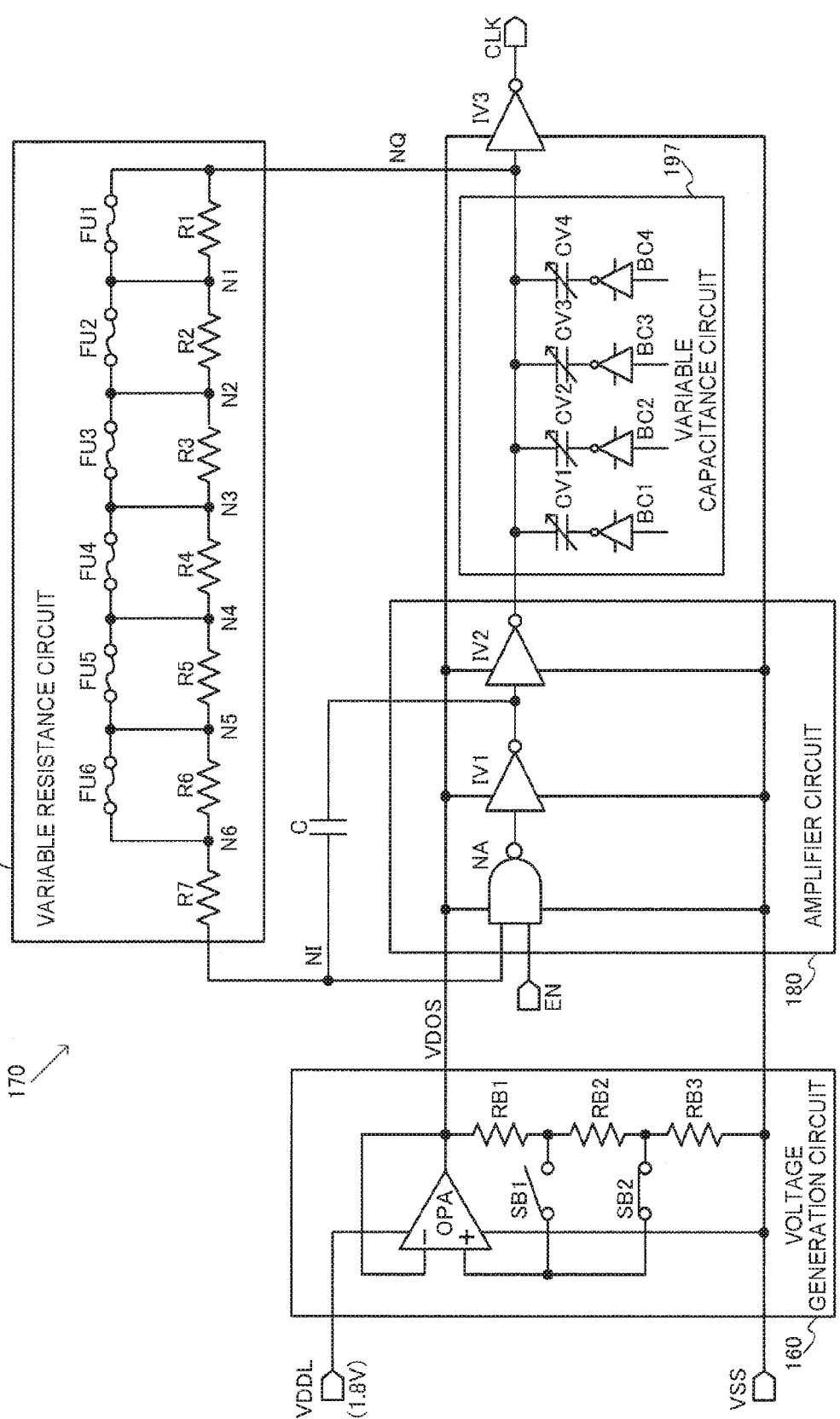
FIG. 9 is a detailed configuration example of the clock signal generation circuit.

Next, the detailed configuration example of the clock signal generation circuit 150 will be described with reference to FIG. 9. FIG. 9 illustrates a detailed configuration example of the voltage generation circuit 160, the amplifier circuit 180 constituting the CR oscillation circuit 170, the variable resistance circuit 196 and the variable capacitance circuit 197.

The voltage generation circuit 160 includes an operational amplifier OPA, resistive elements RB1, RB2, and RB3, and switching elements SB1 and SB2. The resistive elements RB1, RB2, and RB3 are connected in series to each other between the output node of the power supply voltage VDOS and the node of VSS. The inverting input terminal (first terminal) of the operational amplifier OPA is connected to the output node of the operational amplifier OPA. The non-inverting input terminal (second terminal) of the operational amplifier OPA is connected to the connection nodes of the resistive elements RB1 and RB2 through the switching element SB1, and is connected to the connection nodes of the resistive elements RB2 and RB3 through the switching element SB2. A voltage based on a work function difference is generated between the inverting input terminal and the non-inverting input terminal of the operational amplifier OPA.

The coarse adjustment (RCA) based on the power supply voltage described in FIG. 8 is realized by on-off control of the switching elements SB1 and SB2. For example, when the vibrator element A is connected to the circuit device, the switching element SB2 is turned on, and the switching element SB1 is turned off. In this manner, the power supply voltage VDOS is set to the first voltage which is low, and the oscillation frequency of the CR oscillation circuit 170 becomes lower. Thereby, it is possible to adjust the oscillation frequency in the adjustment line VLA of FIG. 8.

On the other hand, when the vibrator element B is connected to the circuit device, the switching element SB1 is turned on, and the switching element SB2 is turned off. In this manner, the power supply voltage VDOS is set to the second voltage which is high, and the oscillation frequency of the CR oscillation circuit 170 becomes higher. Thereby, it is possible to adjust the oscillation frequency in the adjustment line VLB.

The amplifier circuit 180 includes a NAND circuit NA, and inverter circuits IV1 and IV2. The output of the inverter circuit IV1 is fed back to the input node NI of the amplifier circuit 180 through the capacitor C. The output of the inverter circuit IV2 is fed back to the input node NI of the amplifier circuit 180 through the variable resistance circuit

196. The first input of the NAND circuit NA serves as the input of the amplifier circuit 180, and an enable signal EN is input to the second input of the NAND circuit NA. The CR oscillation circuit 170 is set to be in an operation enable state when the enable signal EN enters an H level, and is set to be in an operation disable state when the enable signal EN enters an L level.

The variable resistance circuit 196 includes a plurality of resistive elements R1 to R6 which are connected in series to each other, and a plurality of fuse elements FU1 to FU6 (switching elements in a broad sense) in which the respective fuse elements are connected in parallel to the respective resistive elements of the plurality of resistive elements R1 to R6. For example, the fuse element FU1 is connected in parallel to the resistive element R1, and the fuse element FU2 is connected in parallel to the resistive element R2. The same is true of the connection configuration between the fuse elements FU3 to FU6 and the resistive elements R3 to R6. In addition, the variable resistance circuit 196 includes a reference resistive element R7 which is connected in series to the plurality of resistive elements R1 to R6. That is, the plurality of resistive elements R1 to R6 and the reference resistive element R7 are connected in series to each other between the output node NQ and the input node NI of the amplifier circuit 180.

The variable capacitance circuit 197 includes variable capacitance elements CV1 to CV4 and capacitance control voltage output circuits BC1 to BC4. One end of each of the variable capacitance elements CV1 to CV4 is connected to the output node NQ of the amplifier circuit 180, and the other end is connected to the output of each of the capacitance control voltage output circuits BC1 to BC4. Each of the variable capacitance elements CV1 to CV4 is an element of which the capacitance is changed by a capacitance control voltage which is output by each of the capacitance control voltage output circuits BC1 to BC4. The variable capacitance elements CV1 to CV4 can be realized by, for example, a varicap (varactor) or the like. The variable capacitance circuit 197 can be realized by, for example, an array of variable capacitance elements weighted by a binary, and control based on a capacitance control voltage becomes binary control of a high level and a low level in this case. According to the variable capacitance circuit 197, the fine adjustment of the oscillation frequency at, for example, 30 KHz/step can be performed.

The voltage generation circuit 160 generates the power supply voltage VDOS having, for example, negative temperature characteristics (first temperature characteristics) on the basis of the work function difference of a transistor, and supplies the generated voltage as a power supply of the amplifier circuit 180 of the CR oscillation circuit 170. For example, the power supply voltage VDDL on the high-potential side and the power supply voltage VSS (GND) on the low-potential side are supplied to the voltage generation circuit 160 (regulator circuit). The voltage generation circuit 160 includes a first transistor and a second transistor having the conductivity of a gate electrode different from that of the first transistor. For example, when the gate electrode of the first transistor is an N-type, the gate electrode of the second transistor is set to a P-type. The voltage generation circuit 160 supplies a voltage corresponding to the work function difference between the first and second transistors, as the power supply voltage VDOS. That is, the power supply voltage VDOS based on the work function difference between heterogeneous gates is supplied. The power supply voltage VDOS based on the work function difference has, for example, negative temperature characteristics, and the power supply voltage VDOS becomes lower when a temperature rises.

Specifically, the operational amplifier OPA of the voltage generation circuit 160 includes a differential unit and an output unit. The differential unit includes a current mirror circuit, first and second transistors constituting a differential pair, and a current source. The first transistor constituting the differential pair is formed as a transistor of which the conductivity of the gate electrode is different from that of the second transistor. For example, the gate electrode of the first transistor is set to an N-type, and the gate electrode of the second transistor is set to a P-type. For example, the first transistor and the second transistor are configured such that the impurity concentrations of a substrate or the impurity concentrations of a channel are the same as each other, but the conductivities of the gate electrodes are different from each other, and that the impurity concentrations of the gate electrodes are different from each other.

For example, the threshold voltage of a MOS transistor can be represented by $Vth = \phi_{MS} - Q_{SS}/C_{OX} + 2\phi_F + Q_D/C_{OX}$. Herein, $\phi_{MS}$ is a work function difference between the gate electrode and the substrate, $Q_{SS}$ is fixed charge within an oxide film, $C_{OX}$ is a capacitance per unit area of a gate oxide film, $\phi_F$ is a Fermi level, and $Q_D$ is charge within a depletion layer. The threshold voltage VTN of the depression-type first transistor is set to, for example, −0.52 V by setting the impurity concentration of the N-type gate electrode of the first transistor and the impurity concentration of the P-type gate electrode of the second transistor. On the other hand, the threshold voltage VTP of the enhancement-type second transistor is set to, for example, 0.45 V. Thereby, a voltage VOF=VTP−VTN=0.97 V based on the work function difference is generated between the inverting input terminal and the non-inverting input terminal of the operational amplifier OPA. Therefore, the power supply voltage VDOS which is set by the voltage VOF based on the work function difference is set to a constant voltage and has negative temperature characteristics even when the power supply voltage VDDL fluctuates.

On the other hand, the oscillation frequency of the CR oscillation circuit 170 has positive temperature characteristics when the power supply voltage VDOS is a fixed voltage (constant). That is, in a condition in which the power supply voltage VDOS is fixed, the oscillation frequency becomes higher when a temperature rises.

For example, the oscillation frequency of the CR oscillation circuit 170 when the influence of a signal delay of each circuit of the NAND circuit NA or the inverter circuits IV1 and IV2 is excluded is set to f0. Then, the oscillation frequency f0 of the CR oscillation circuit 170 is generally represented as in the following Expression (1).

$$f0 = 1/(2.2 \times C \times R) \qquad (1)$$

In the present embodiment, a resistor having negative temperature characteristics is used as the resistor R (R1 to R7). For example, a polysilicon resistor or the like is used as the resistor R (R1 to R7). Since the polysilicon resistor has negative temperature characteristics, the resistance value of the resistor R becomes lower when a temperature rises. Therefore, when a temperature rises, the oscillation frequency f0=1/(2.2×C×R) becomes higher. That is, the oscillation frequency f0 excluding the influence of the signal delay of each circuit such as the NAND circuit has positive temperature characteristics.

In addition, the threshold voltage of the MOS transistor constituting each circuit of the NAND circuit NA and the inverter circuits IV1 and IV2 has negative temperature characteristics, and the threshold voltage drops when a temperature rises. When the threshold voltage drops, the delay time of a signal in each circuit such as the NAND circuit becomes shorter, and the oscillation frequency of the CR oscillation circuit 170 rises. For example, when the load capacitance of each circuit is set to CL, the drain current is set to ID, the power supply voltage is set to VDOS, and the predetermined coefficient is set to k, the delay time in each circuit can be represented as in the following Expression (2).

$$td=k\{(CL\times VDOS)/ID\} \quad (2)$$

When a temperature rises and the threshold voltage drops from Expression (2), the delay time td becomes shorter and the oscillation frequency when the power supply voltage VDOS is fixed rises by an increase in the drain current ID.

Figure 10A:
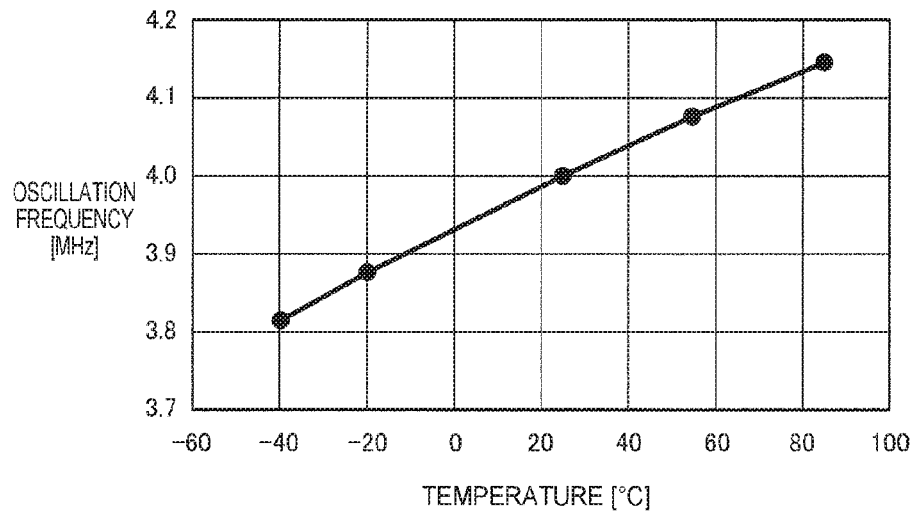
FIG. 10A is temperature characteristics of the oscillation frequency during power supply voltage fixation.

FIG. 10A is a diagram illustrating the temperature characteristics (simulation result) of the oscillation frequency when the power supply voltage VDOS is fixed. As described above, when a temperature rises, the resistance value of the resistor R (R1 to R7) becomes lower. Thereby, f0=1/(2.2×C×R) becomes higher, and the delay time td of each circuit such as the NAND circuit becomes shorter. Therefore, as shown in FIG. 10A, the oscillation frequency of the CR oscillation circuit 170 in a case where the power supply voltage VDOS is fixed becomes higher when a temperature rises, and has positive temperature characteristics.

Figure 10B:
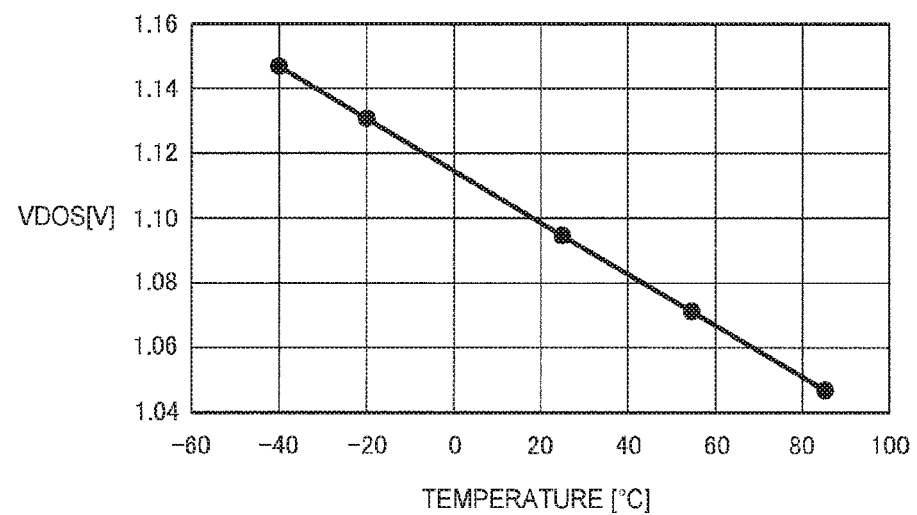
FIG. 10B is a diagram illustrating temperature characteristics of a power supply voltage generated by a power supply voltage generation circuit.

FIG. 10B is a diagram illustrating the temperature characteristics (simulation result) of the power supply voltage VDOS. As described above, in the present embodiment, the voltage generation circuit 160 generates the power supply voltage VDOS of negative temperature characteristics on the basis of the work function difference of the transistor. Therefore, as shown in FIG. 10B, the power supply voltage VDOS is reduced when a temperature rises, and has negative temperature characteristics.

FIG. 11 is a diagram illustrating a fluctuation rate (actual device measurement result) of the oscillation frequency of the CR oscillation circuit 170. In the present embodiment, when the power supply voltage VDOS is fixed as shown in FIG. 10A, the power supply voltage VDOS having negative temperature characteristics as shown in FIG. 10B is supplied to the CR oscillation circuit 170 in which the oscillation frequency has positive temperature characteristics. With such a configuration, the positive temperature characteristics (FIG. 10A) of the oscillation frequency in the simplex of the CR oscillation circuit 170 can be canceled by the negative temperature characteristics (FIG. 10B) of the power supply voltage VDOS. Thereby, as shown in FIG. 11, the fluctuation rate of the oscillation frequency to a temperature fluctuation can be kept low. In this manner, according to the present embodiment, it is possible to perform appropriate temperature compensation of the oscillation frequency, and to supply a clock signal having a low fluctuation rate of a frequency to the temperature fluctuation.

For example, in the related art, in order to realize the temperature compensation of the oscillation frequency, it is necessary to separately provide another circuit element such as an operational amplifier in addition to a reference voltage generation circuit or an amplifier circuit of the oscillation circuit. For this reason, there is a problem in that an increase in power consumption or circuit scale is caused.

On the other hand, in the present embodiment, the temperature compensation of the oscillation frequency can be realized by just providing the voltage generation circuit 160 that supplies the power supply voltage VDOS having negative temperature characteristics as shown in FIG. 10B to the CR oscillation circuit 170. Therefore, it is possible to realize the temperature compensation of the oscillation frequency while suppressing an increase in consumption current or circuit scale.

That is, general temperature compensation is realized by combining circuit elements having positive and negative different temperature characteristics. On the other hand, in the present embodiment, focusing on the oscillation frequency of the CR oscillation circuit 170 during power supply voltage fixation having positive temperature characteristics as shown in FIG. 10A, the power supply voltage VDOS having negative temperature characteristics for canceling (offsetting) the positive temperature characteristics is supplied to the CR oscillation circuit 170. Since the power supply voltage VDOS having such negative temperature characteristics can be generated by a simple circuit configuration having a small circuit scale using a work function difference of the transistor, it is possible to minimize an increase in circuit scale. In addition, the work function difference is used, and thus the fluctuation of the oscillation frequency with respect to a power supply voltage fluctuation can also be kept low. That is, even when the power supply voltage VDDL fluctuates, it is possible to minimize a fluctuation in the power supply voltage VDOS based on the work function difference. Therefore, when the positive temperature characteristics of the CR oscillation circuit 170 is offset by supplying the power supply voltage VDOS having the negative temperature characteristics based on such a work function difference, it is possible to minimize not only the fluctuation of the oscillation frequency with respect to a temperature fluctuation, but also the fluctuation of the oscillation frequency with respect to a power supply voltage fluctuation.

In addition, the CR oscillation circuit 170 has an advantage in that a startup time is shorter than that of the oscillation circuit using a vibrator element such as, for example, quartz crystal, and that a stable high-speed clock signal can be supplied early. Therefore, when the operation signal of the circuit device is generated using the clock signal generated by the CR oscillation circuit 170, it is possible to realize the startup of the circuit device or an increase in operating speed.

5. Adjustment of Oscillation Frequency Using Variable Resistance Circuit

Next, a method of adjusting the oscillation frequency using the variable resistance circuit 196 will be described. The adjustment of the oscillation frequency is aimed at adjusting a variation of an element such as a transistor or a resistor due to a semiconductor wafer process to a desired oscillation frequency using the variable resistance circuit 196.

The resistance values of the resistive elements R1 to R6 of the variable resistance circuit 196 in FIG. 9 are weighted by, for example, a binary. For example, each resistive element of R1 to R6 is constituted by one or a plurality of unit resistors. For example, R1 is constituted by $2^0=1$ resistor unit, R2 is constituted by $2^1=2$ resistor units which are connected in series to each other, and R3 is constituted by $2^2$ resistor units which are connected in series to each other. Similarly, R4, R5, and R6 are constituted by $2^3$, $2^4$, and $2^5$ resistor units, respectively, which are connected in series to each other. Therefore, when the resistance value of the unit resistor is set to RU, the resistance value of R1 is set to $2^0\times RU(=RU)$, the resistance value of R2 is set to $2^1\times RU(=2\times RU)$, the resistance value of R3 is set to $2^2\times RU$, the resistance value of R4 is set to $2^3 \times$RU, the resistance value of R5 is set to $2^4 \times$RU, and the resistance value of R6 is set to $2^5 \times$RU.

On the other hand, R7 is a reference resistive element for setting a reference oscillation frequency. When the reference resistance value which is the resistance value of R7 is set to RB, RB can be set to, for example, substantially the same resistance value as R6. With such a setting, the resistance value of the variable resistance circuit 196 can be set so as to be variable within a predetermined range (for example, range of RB to RB+RU×($2^6$−1)).

As shown in FIG. 9, each fuse element of FU1 to FU6 is provided in parallel to each resistive element of R1 to R6. Before fuse cut, all the fuse elements FU1 to FU6 are set to be in a non-cut state. Therefore, the resistance value of the variable resistance circuit 196 is set to the reference resistance value RB of R7 (accurately, parasitic resistance value such as RB+fuse element). The oscillation frequency of the CR oscillation circuit 170 is measured in this state. When the measured oscillation frequency is set to fr, a fuse value is calculated by a trimming expression represented by the linear expression of fr, for example, as shown in the following Expression (3). Meanwhile, a and b are constants.

$$\text{fuse value} = a \times fr + b \quad (3)$$

Which of the fuse elements FU1 to FU6 is cut (trimmed) is determined on the basis of the calculated fuse value. For example, the fuses FU1, FU3, FU4, and FU5 are assumed to be cut on the basis of the fuse value calculated in the trimming expression. In this case, the resistance value of the variable resistance circuit 196 is set to RB+R1+R3+R4+R5 (+parasitic resistance value).

Specifically, the fuse value (fuse value after conversion into an integer) is converted into data of a binary expression, and thus it is possible to determine a fuse element to be cut. For example, the fuse element FU1 is cut when the fuse value=1=$2^0$, the fuse element FU2 is cut when the fuse value=2=$2^1$. In addition, the fuse elements FU1 and FU2 are cut when the fuse value=3=$2^0+2^1$, the fuse element FU3 is cut when the fuse value=4=$2^2$, and the fuse elements FU1 and FU3 are cut when the fuse value=5=$2^0+2^2$. That is, the fuse FU1 is equivalent to LSB of the fuse value of a binary expression, the fuse FU2 is equivalent to the next bit of LSB, and the fuse FU3 is equivalent to the next bit. Similarly, the fuse FU6 is equivalent to MSB of the fuse value of a binary expression. The fuse FU1 is cut when LSB of the fuse value is 1, and the fuse is not cut when it is 0. The fuse FU2 is cut when the next bit of LSB is 1, and the fuse is not cut when it is 0.

Figure 12:
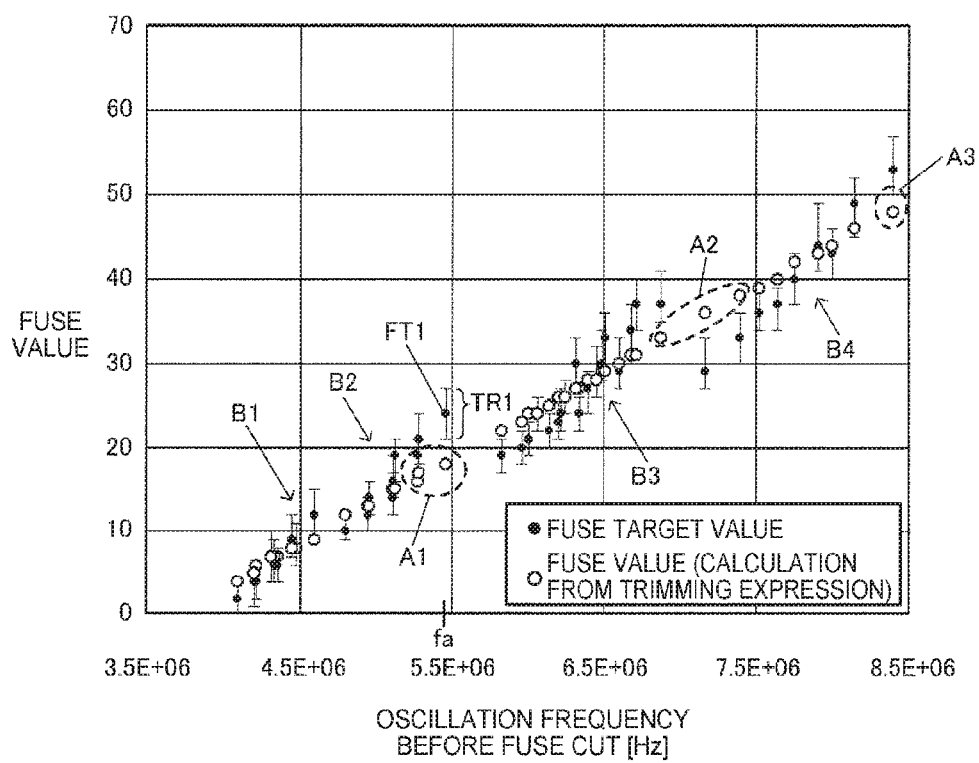
FIG. 12 is a diagram illustrating a relationship between the oscillation frequency before fuse cut, and a fuse target value and a fuse value.

FIG. 12 is a diagram illustrating a relationship between the oscillation frequency fr measured before fuse cut, and a fuse target value and the fuse value calculated in trimming expression (Expression (3)).

For example, FIG. 12 is a diagram in which the fuse target value (target value of the fuse value) for setting the oscillation frequency to a target frequency is obtained by performing a simulation where process conditions are changed. FT1 (black circle) of FIG. 12 is a fuse target value when the oscillation frequency before fuse cut is fr=fa. In addition, TR1 of FIG. 12 is a fuse target value range which is set with respect to the fuse target value FT1. When the target frequency is, for example, 4 MHz, the fuse target value range TR1 is set with respect to a range in which the oscillation frequency is set to, for example, 4 MHz±5%. That is, when the fuse value falls within the fuse target value range TR1 in a case where the oscillation frequency before fuse cut is fr=fa in specific process conditions, the oscillation frequency falls within a range of 4 MHz±5%.

As shown in B1, B2, B3, and B4 of FIG. 12, the fuse target value changes depending on the process conditions.

For example, B1 of FIG. 12 is a fuse target value corresponding to process conditions in which the threshold voltage of the transistor of the amplifier circuit 180 is high, and the resistance value of the variable resistance circuit 196 or the capacitance value of the capacitor Cis large. That is, it is a simulation result of the fuse target value performed in the process conditions. In this case, the oscillation frequency fr before fuse cut is set to a low frequency, and the fuse value for setting the oscillation frequency to the target frequency is set to a small value. Therefore, the fuses are cut in the setting (the number of fuses to be cut is small) in which the fuse value is set to a small value, and thus it is possible to bring the oscillation frequency close to the target frequency.

On the other hand, B4 of FIG. 12 is a fuse target value corresponding to process conditions in which the threshold voltage of the transistor of the amplifier circuit 180 is low, and the resistance value of the variable resistance circuit 196 or the capacitance value of the capacitor C is small. In this case, the oscillation frequency fr before fuse cut is set to a high frequency, and the fuse value for setting the oscillation frequency to the target frequency is set to a large value. Therefore, the fuses are cut in the setting (the number of fuses to be cut is large) in which the fuse value is set to a large value, and thus it is possible to bring the oscillation frequency close to the target frequency.

Coefficients a and b of the trimming expression of the fuse value in Expression (3) can be set on the basis of the simulation result of the fuse target value in FIG. 12.

However, as shown in A1 and A2 of FIG. 12, the fuse value obtained from the trimming expression may fall out of the fuse target value range (target frequency±5%). For example, the fuse value (white circle) in a case where the oscillation frequency before fuse cut is fr=fa falls out of the fuse target value range TR1 (4 MHz±5%) of the fuse target value FT1 (black circle). This is because the trimming expression of Expression (3) is the linear expression of fr, and the fuse target value in a case where the process conditions are changed as shown in B1, B2, B3, and B4 of FIG. 12 is not able to be accurately fit by such a trimming expression of the linear expression. That is, this is because, due to a variation or the like in the threshold voltage of the transistor, the value of the segment of the linear expression corresponding to each of the process conditions of B1, B2, B3, and B4 is set to a different value for each of the process conditions.

Therefore, in a method of obtaining a fuse value on the basis of the oscillation frequency fr before fuse cut using the trimming expression of Expression (3), and determining a fuse to be cut on the basis of the obtained fuse value, there is a problem in that it is not likely that the oscillation frequency is caused to fall within a desired fuse target value range (4 MHz±5%).

Figure 13A:
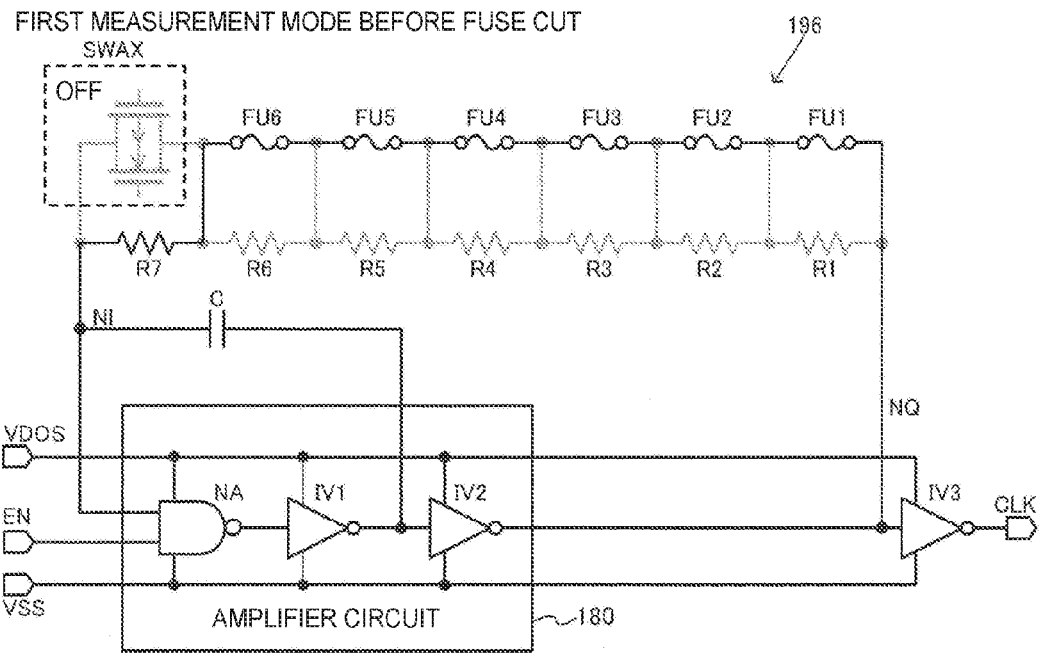
FIGS. 13A and 13B are diagrams illustrating a method of adjusting the oscillation frequency using a trimming auxiliary switch.

In order to solve such a problem, in the present embodiment, a trimming auxiliary switch SWAX as shown in FIG. 13A is provided. For example, in FIG. 13A, the variable resistance circuit 196 includes a plurality of resistive elements R1 to R6 which are connected in series to each other and a reference resistive element R7, and a plurality of fuse elements FU1 to FU6 in which each fuse element is provided in parallel to each resistive element of the plurality of resistive elements R1 to R6. The trimming auxiliary switch SWAX is provided in parallel to the reference resistive element R7.

As shown in FIG. 13A, the trimming auxiliary switch SWAX is turned off in a first measurement mode of the oscillation frequency before fuse cut. Thereby, it is possible to realize a state where the reference resistive element R7 and the fuse elements FU1 to FU6 are connected in series to each other between the output node NQ and the input node NI.

Figure 13B:
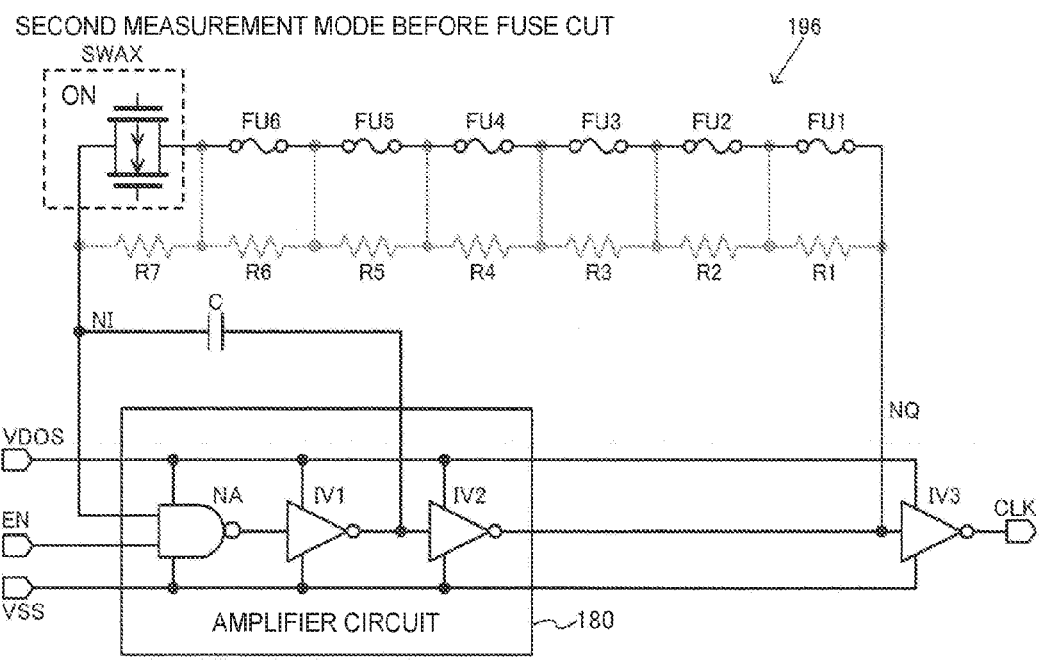

On the other hand, as shown in FIG. 13B, the trimming auxiliary switch SWAX is turned on in a second measurement mode of the oscillation frequency before fuse cut. Thereby, it is possible to realize a state where the fuse elements FU1 to FU6 and the trimming auxiliary switch SWAX are connected in series to each other between the output node NQ and the input node NI.

For example, the oscillation frequency in the first measurement mode (FIG. 13A) before fuse cut is set to fr1, and the oscillation frequency in the second measurement mode (FIG. 13B) before fuse cut is set to fr2. In this case, the fuse value is calculated by the trimming expression of the following Expression (4) represented by the linear expression of fr1 and fr2. Meanwhile, c, d, and e are constants.

$$\text{fuse value} = c \times fr1 + d \times fr2 + e \quad (4)$$

Figure 14:
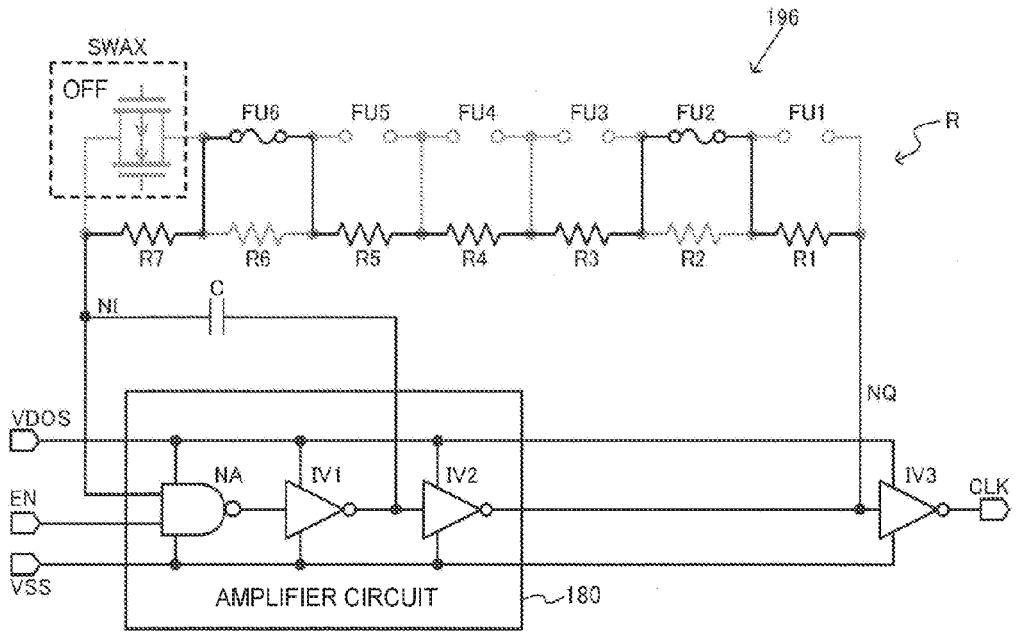
FIG. 14 is a diagram illustrating a method of adjusting the oscillation frequency using the trimming auxiliary switch.

The fuses are cut as shown in FIG. 14 on the basis of the fuse value calculated in the trimming expression of Expression (4). In FIG. 14, the fuses FU1, FU3, FU4, and FU5 are cut.

According to the above method of the present embodiment, as shown in FIGS. 13A and 13B, the oscillation frequencies fr1 and fr2 before fuse cut can be measured in two state of a case where the reference resistive element R7 is in a connection state and a case where the reference resistive element is in a non-connection state. Therefore, as shown in FIG. 13B, it is possible to measure the oscillation frequency fr2 which is determined by the characteristics of the threshold voltage of the transistor of the amplifier circuit 180 and the capacitance of the capacitor C. Thereby, it is possible to appropriately correct a variation in the fuse value caused by a variation in the threshold voltage of the transistor. As a result, the oscillation frequency in a case where the fuse element is cut on the basis of the calculation value of the trimming expression is easily caused to fall within the target frequency range.

Figure 15:
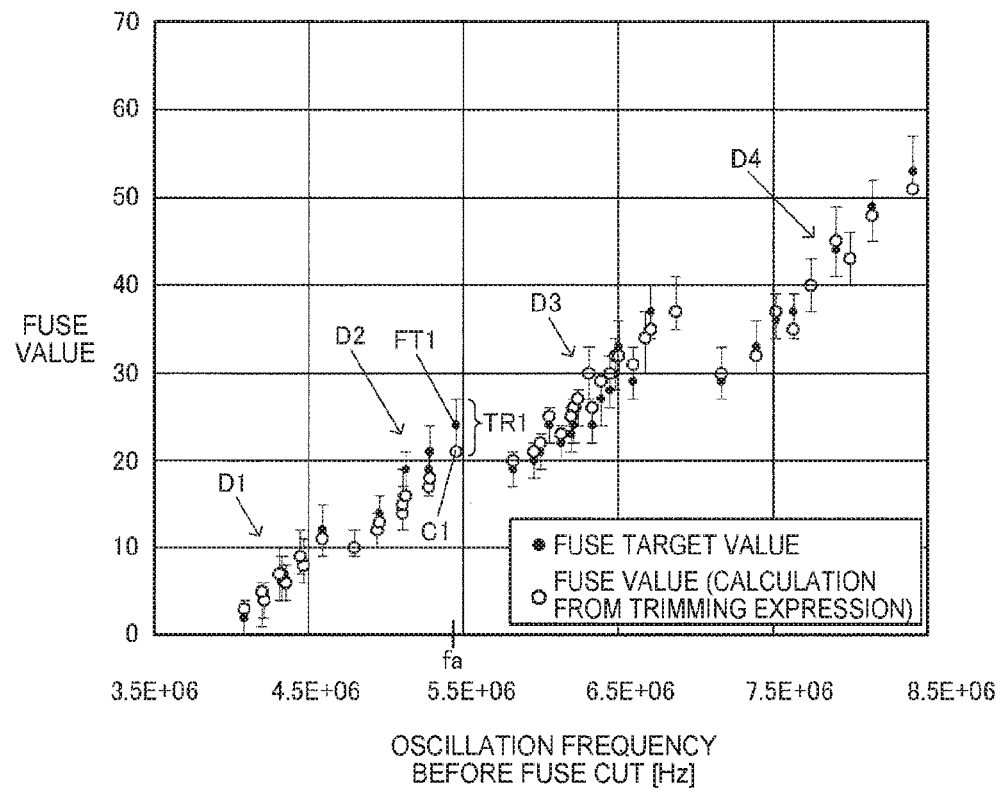
FIG. 15 is a diagram illustrating a relationship between the oscillation frequency before fuse cut, and the fuse target value and the fuse value when an adjustment method of the present embodiment is used.

For example, FIG. 15 is a diagram illustrating a relationship between the oscillation frequency and the fuse value before fuse cut when the adjustment method of the present embodiment is used. The fuse value of FIG. 15 is a value calculated in the trimming expression of Expression (4).

For example, the fuse value corresponding to the oscillation frequency fa falls out of the fuse target value range TR1 as shown in A1 in FIG. 12, but falls within the fuse target value range TR1 as shown in C1 in FIG. 15. Therefore, according to the adjustment method of the present embodiment, the fuse value is calculated in the trimming expression of Expression (4), and the fuses are cut on the basis of the calculated fuse value, whereby the oscillation frequency can be caused to fall within a desired fuse target value range (4 MHz±5%).

That is, in the present embodiment, even when the value of the segment of the linear expression corresponding to each of the process conditions of D1, D2, D3, and D4 in FIG. 15 is set to a different value for each of the process conditions due to a variation or the like in the threshold voltage of the transistor, the fuses are cut by calculating a fuse value closer to the fuse target value. That is, the trimming expression of Expression (4) is used, and thus it is possible to further fit the fuse value to the fuse target value, and to cause the oscillation frequency to fall within a desired fuse target value range (4 MHz±5%). Therefore, it is possible to realize a method of adjusting an oscillation frequency having higher accuracy.

6. Method of Manufacturing Physical Quantity Detection Device

Next, a method of manufacturing (method of adjusting the oscillation frequency) the physical quantity detection device including the physical quantity transducer and the circuit device will be described with reference to a flow diagram of FIG. 16.

First, a semiconductor wafer (circuit device) is manufactured (step S1). That is, circuit elements such as a transistor, a resistive element and a capacitance element constituting the circuit device (semiconductor chip), and wirings are formed on the substrate (silicon substrate) of the semiconductor wafer by a known manufacturing method. That is, the circuit elements and the wirings are formed by a manufacturing process such as film formation, development, exposure, resist coating, etching, resist peeling-off and impurity implantation. Thereby, the semiconductor wafer having a plurality of circuit devices formed therein is manufactured.

Next, an inspection in the state of the semiconductor wafer is performed (step S2). Specifically, the oscillation frequency of the oscillation circuit 190 of each circuit device is measured (step S3). For example, the circuit device of the semiconductor wafer is probed, and the oscillation frequency is measured. A frequency adjustment value for setting the oscillation frequency to a target oscillation frequency is obtained (step S4). For example, the fuse value is obtained as the frequency adjustment value by the method described in FIGS. 13A to 15 or the like. The fuses are cut on the basis of the obtained frequency adjustment value (fuse value) (step S5). That is, as shown in FIG. 14, the fuse element specified by the fuse value is cut. In this manner, after an inspection in the semiconductor wafer is performed, the semiconductor wafer is diced, and the chip of the circuit device is manufactured.

Next, an inspection after packaging of the vibrator element 10 (physical quantity transducer) and the circuit device (IC) is performed (step S6). That is, a module inspection of the physical quantity detection device configured by the vibrator element 10 and the circuit device being connected to each other and housed in the package is performed. Specifically, at first, a drive frequency is measured (step S7). That is, an actual measured value of the drive frequency of the vibrator element 10 connected to the circuit device is measured. The frequency adjustment value for setting the oscillation frequency keeping out of the interference frequency is obtained (step S8).

That is, as described in FIG. 8, target oscillation frequencies (ft1, ft2, and ft3) capable of keeping out of the interference frequency are obtained using the measured drive frequencies (fd1, fd2, and fd3). The frequency adjustment value for setting to the obtained target oscillation frequency is obtained. Specifically, as the frequency adjustment value for setting to the target oscillation frequency, the capacitance adjustment value of the variable capacitance circuit 197 is obtained. The obtained frequency adjustment value (capacitance adjustment value) is stored in the storage unit 130 (step S9). For example, the storage unit 130 is a non-volatile memory, and the frequency adjustment value is written in this non-volatile memory. In this manner, the frequency adjustment value is read out from the non-volatile memory which is the storage unit 130 during power activation of the circuit device or the like, and the oscillation frequency of the oscillation circuit 190 is adjusted by the frequency adjustment value. Specifically, the capacitance value of the variable capacitance circuit 197 is adjusted on the basis of the capacitance adjustment value which is the frequency adjustment value, and thus the oscillation frequency is set to a frequency keeping out of the interference frequency.

Figure 16:
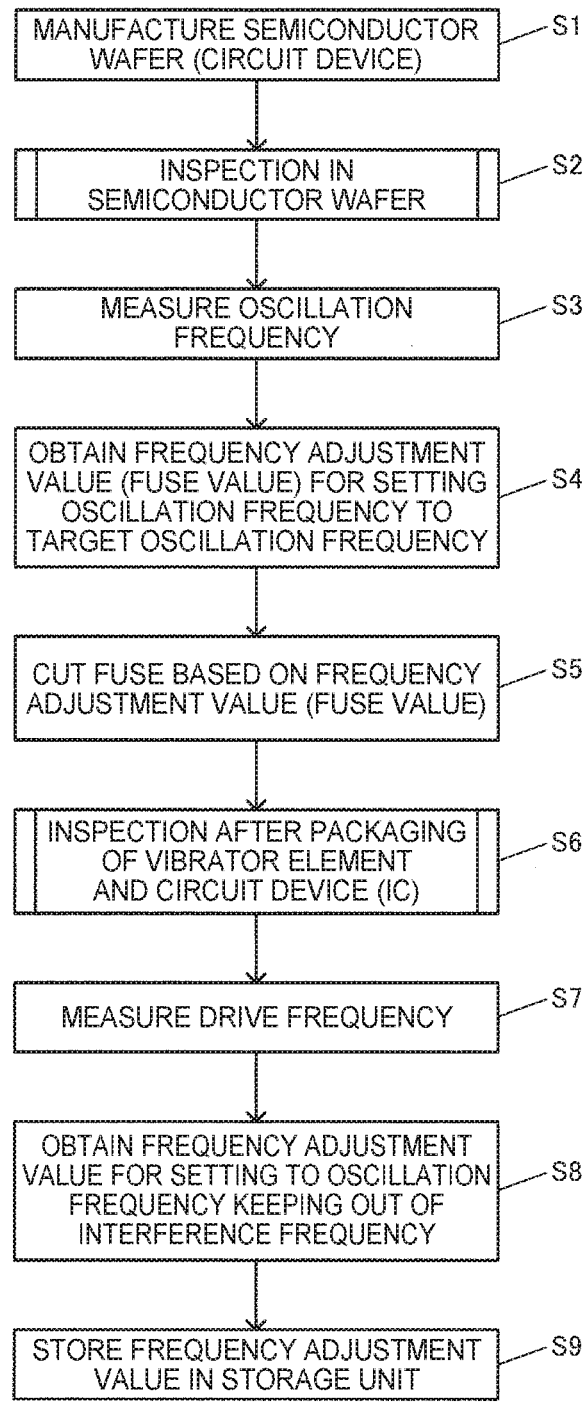
FIG. 16 is a flow diagram illustrating a method of manufacturing a physical quantity detection device of the present embodiment.
Figure 17:
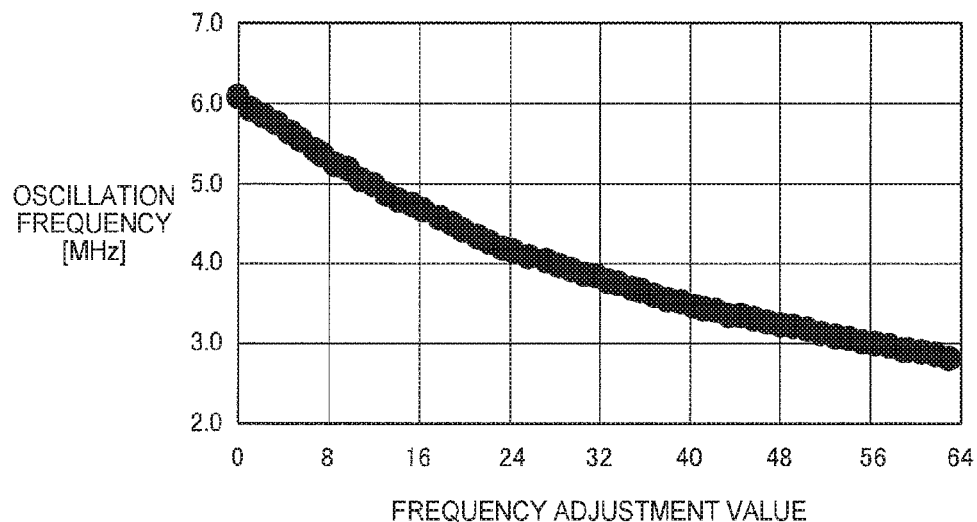
FIG. 17 is a diagram illustrating a first frequency adjustment which is a coarse adjustment of the oscillation frequency.

As described above, in the manufacturing method of the present embodiment, the circuit device including the detection circuit 60, the clock signal generation circuit 150, and the like is manufactured (step S1 of FIG. 16). Next, before the vibrator element 10 (physical quantity transducer) and the circuit device are connected to each other, a first frequency adjustment for adjusting the oscillation frequency of the oscillation circuit 190 is performed (steps S3, S4, and S5). This first frequency adjustment is performed by the first frequency adjustment unit 191 (variable resistance circuit 196). For example, FIG. 17 illustrates a relationship between the oscillation frequency and the frequency adjustment value (fuse value) in the first frequency adjustment. As shown in FIG. 17, in the first frequency adjustment, the adjustment range of the oscillation frequency is wide, but the adjustment step of the oscillation frequency is coarse, and thus it is possible to realize the coarse adjustment of the oscillation frequency.

Figure 18:
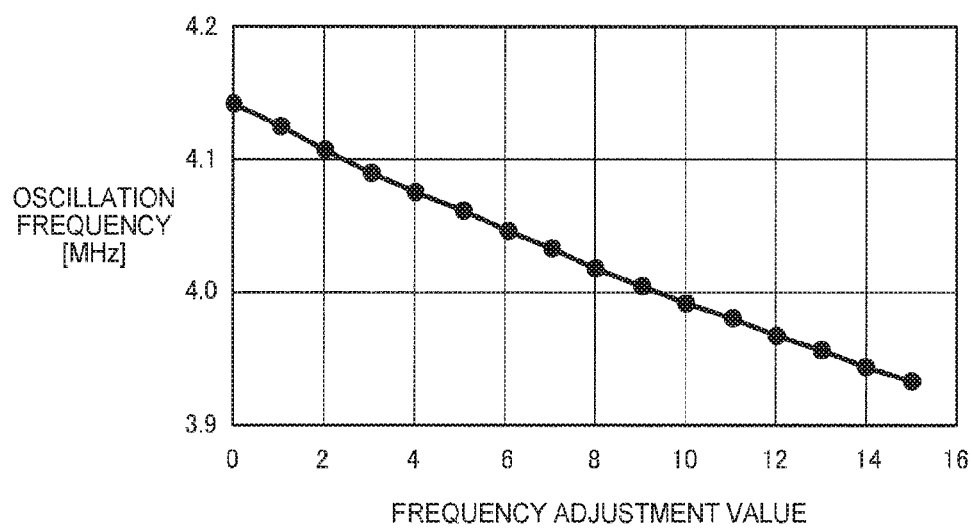
FIG. 18 is a diagram illustrating a second frequency adjustment which is a fine adjustment of the oscillation frequency.

Next, in a state where the vibrator element 10 and the circuit device are connected to each other, a second frequency adjustment for adjusting the oscillation frequency of the oscillation circuit 190 is performed (steps S7 and S8). This second frequency adjustment is performed by the second frequency adjustment unit 192 (variable capacitance circuit 197). For example, FIG. 18 illustrates a relationship between the oscillation frequency and the frequency adjustment value (capacitance adjustment value) in the second frequency adjustment. As shown in FIG. 18, in the second frequency adjustment, the adjustment range of the oscillation frequency is narrow, the adjustment step of the oscillation frequency is fine, and thus it is possible to realize the fine adjustment of the oscillation frequency.

In this manner, according to the present embodiment, it is possible to manufacture a physical quantity detection device capable of reducing a deterioration in detection performance occurring due to the influence of the drive frequency component of the vibrator element 10 on the detection circuit including a circuit operating through a signal based on the clock signal.

7. Detection Circuit

Figure 19:
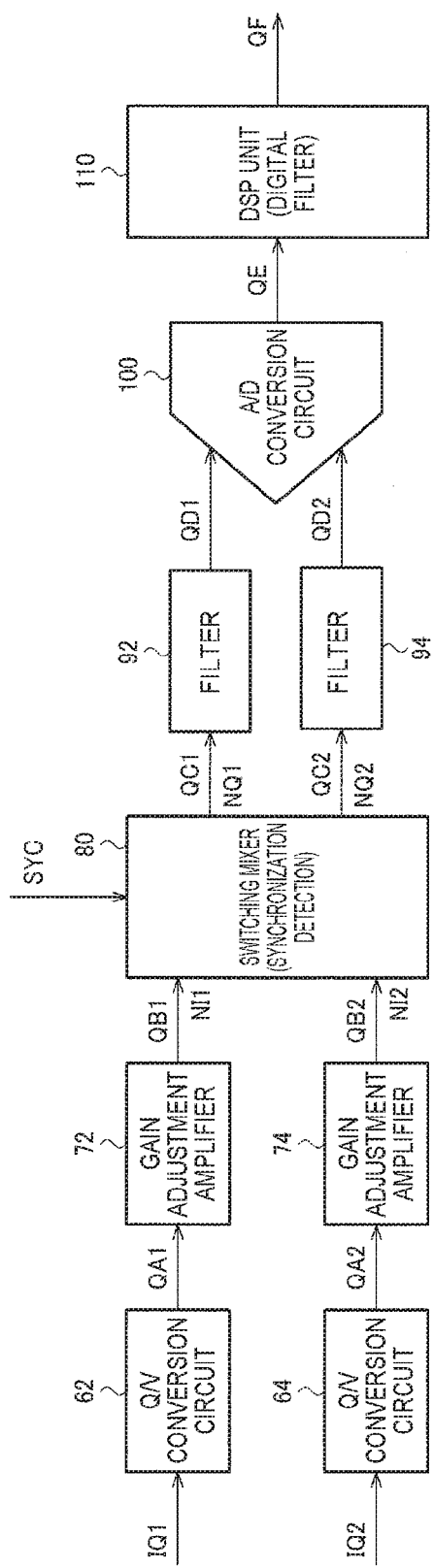
FIG. 19 is a detailed configuration example of the detection circuit.

FIG. 19 illustrates a detailed configuration example of the detection circuit 60. FIG. 19 is an example of the fully-differential switching mixer type detection circuit 60.

The differential first and second detection signals IQ1 and IQ2 from the vibrator element 10 are input to Q/V conversion circuits 62 and 64 (charge-voltage conversion circuits). The Q/V conversion circuits 62 and 64 convert charge (current) generated in the vibrator element 10 into a voltage. These Q/V conversion circuits 62 and 64 are continuous charge-voltage conversion circuits including a feedback resistor.

Gain adjustment amplifiers 72 and 74 amplify output signals QA1 and QA2 of the Q/V conversion circuits 62 and 64 by adjusting the gains thereof. The gain adjustment amplifiers 72 and 74 are so-called programmable gain amplifiers, and amplify the signals QA1 and QA2 based on the set gain. For example, the signals are amplified to signals having an amplitude suitable to the voltage conversion range of the A/D conversion circuit 100.

A switching mixer 80 is a mixer that performs differential synchronous detection on the basis of the synchronizing signal SYC from the drive circuit 30.

Specifically, in the switching mixer 80, the output signal QB1 of the gain adjustment amplifier 72 is input to the first input node NI1, and the output signal QB2 of the gain adjustment amplifier 74 is input to the second input node NI2. The differential synchronous detection is performed by the synchronizing signal SYC from the drive circuit 30, and the first and second differential output signals QC1 and QC2 are output to the first and second output nodes NQ1 and NQ2. An undesired signal such as noise (1/f noise) generated by pre-stage circuits (Q/V conversion circuit and gain adjustment amplifier) is frequency-converted into high-frequency band by the switching mixer 80. In addition, a desired signal which is a signal according to a Coriolis force is dropped to a direct-current signal.

The first output signal QC1 from the first output node NQ1 of the switching mixer 80 is input to a filter 92. The second output signal QC2 from the second output node NQ2 of the switching mixer 80 is input to the filter 94. These filters 92 and 94 are, for example, low-pass filters having frequency characteristics that remove (attenuate) an undesired signal and pass a desired signal. For example, an undesired signal such as 1/f noise which is frequency-converted into a high-frequency band by the switching mixer 80 is removed by the filters 92 and 94. In addition, the filters 92 and 94 are, for example, passive filters constituted by passive elements (such as a resistive element and a capacitor).

The A/D conversion circuit 100 receives the output signal QD1 from the filter 92 and the output signal QD2 from the filter 94, and performs differential A/D conversion. Specifically, the A/D conversion circuit 100 performs A/D conversion by sampling the output signals QD1 and QD2, using the filters 92 and 94 as an anti-aliasing filter (pre-filter). In the present embodiment, the output signal QD1 from the filter 92 and the output signal QD2 from the filter 94 are input to the A/D conversion circuit 100 without going through an active element.

As the A/D conversion circuit 100, for example, A/D conversion circuits of various types such as a delta sigma type or a successive comparison type can be adopted. When the delta sigma type is adopted, for example, a function or the like of a chopper or correlated double sampling (CDS) for 1/f noise reduction is included, and an A/D conversion circuit constituted by, for example, a secondary delta-sigma modulator or the like can be used. In addition, when the successive comparison type is adopted, for example, a function or the like of dynamic element matching (DEM) for reducing a deterioration in S/N ratio due to the element variation of a DAC is included, and an A/D conversion circuit constituted by a capacitive DAC and a successive comparison control logic can be used.

The DSP unit 110 performs various types of digital signal processing. For example, the DSP unit 110 performs digital filter processing for limiting a bandwidth in accordance with an application of the desired signal, or digital filter processing for removing noise generated by the A/D conversion circuit 100 and the like. In addition, digital correction processing for gain correction (sensitivity adjustment), offset correction, or the like may be performed.

Meanwhile, the circuit device 20 of the present embodiment is not limited to the configuration of a fully-differential switching mixer type. For example, it is possible to adopt various configurations such as a direct sampling type configuration constituted by a discrete Q/V conversion circuit and an A/D conversion circuit which is directly connected to the discrete Q/V conversion circuit.

Figure 20:
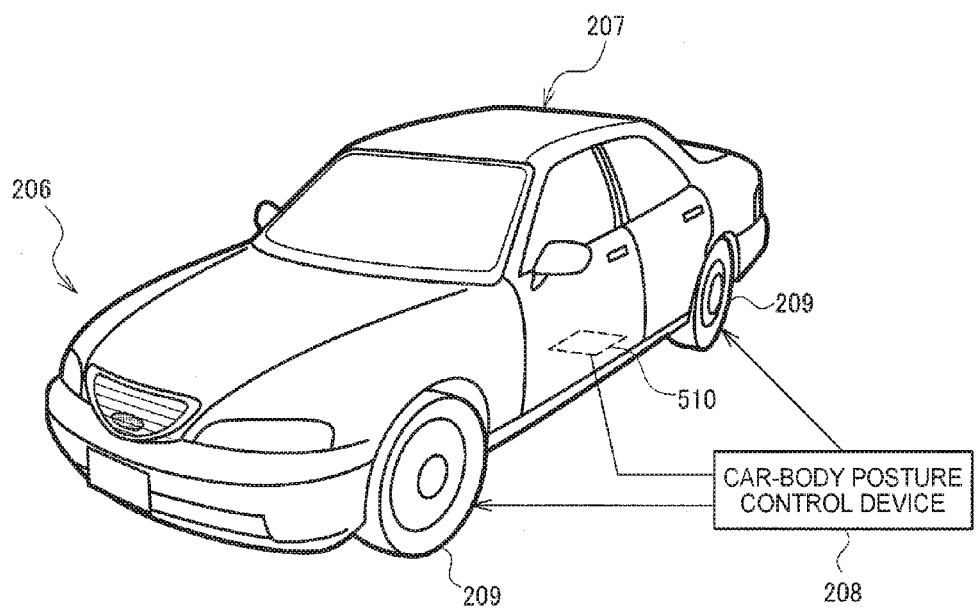
FIG. 20 is a conceptual diagram schematically illustrating a configuration of an automobile as one specific example of a moving object.

FIG. 20 illustrates an example of a moving object including the circuit device 20 of the present embodiment. The circuit device 20 of the present embodiment can be incorporated into, for example, various moving objects such as a vehicle, an airplane, a bike, a bicycle, or a vessel. The moving objects are pieces of equipment or instruments which are provided with, for example, driving mechanisms such as engines or motors, steering mechanisms such as handles or rudders, and various electronic apparatuses, and move on the ground, in the air, and in the sea. FIG. 20 schematically illustrates an automobile 206 as a specific example of the moving object. The gyro sensor 510 (sensor) including the vibrator element 10 and the circuit device 20 is incorporated into the automobile 206. The gyro sensor 510 can detect the posture of a car body 207. A detection signal of the gyro sensor 510 can be supplied to a vehicle body posture control device 208. The vehicle body posture control device 208 can control stiffness and softness of a suspension, for example, in accordance with the posture of the car body 207, or control the brake of an individual wheel 209. In addition thereto, such posture control may be used in various mobile bodies such as a bipedal walking robot, an airplane, and a helicopter. In order to perform posture control, the gyro sensor 510 may be incorporated thereinto.

Although the present embodiment has been described as above in detail, it can be easily understood by a person skilled in the art that various modifications without substantially departing from the new matters and effects of the invention are possible. Therefore, these modifications are all included in the scope of the invention. For example, in the specification or the drawings, the terminologies (gyro sensor, vibrator element, and the like) which are mentioned at least once together with different terminologies (physical quantity detection device, physical quantity transducer, and the like) which have broader senses or the same meanings can be replaced with the different terminologies in any location of the specification or the drawings. In addition, the configurations of the circuit device, the physical quantity detection device, the electronic apparatus, or the moving object, the structure of the vibrator element, and the like are not also limited to those described in the present embodiment, and can be modified variously.

The entire disclosure of Japanese Patent Application No. 2015-010023, filed Jan. 22, 2015 is expressly incorporated by reference herein.

What is claimed is:

1. A circuit device comprising:
a clock signal generation circuit, including an oscillation circuit, which generates a clock signal through the oscillation circuit; and
a detection circuit, including a circuit operating through an operation signal based on the clock signal, to which a detection signal from a physical quantity transducer is input,
wherein the clock signal generation circuit includes
a first frequency adjustment circuit configured to adjust an oscillation frequency of the oscillation circuit before the physical quantity transducer and the circuit device are connected to each other, and
a second frequency adjustment circuit configured to adjust the oscillation frequency of the oscillation circuit in a state where the physical quantity transducer and the circuit device are connected to each other.

2. The circuit device according to claim 1,
wherein the oscillation circuit is a CR oscillation circuit, and
the first frequency adjustment circuit is a variable resistance circuit of the CR oscillation circuit.

3. The circuit device according to claim 2,
wherein the CR oscillation circuit includes an amplifier circuit, and
the variable resistance circuit is a resistance circuit that feeds back a signal of the amplifier circuit to an input node of the amplifier circuit.

4. The circuit device according to claim 3,
wherein the variable resistance circuit includes
a plurality of resistive elements which are connected in series to each other, and
a plurality of fuse elements in which each fuse element is provided in parallel to each resistive element of the plurality of resistive elements.

5. The circuit device according to claim 2,
wherein the variable resistance circuit includes
a plurality of resistive elements which are connected in series to each other, and
a plurality of fuse elements in which each fuse element is provided in parallel to each resistive element of the plurality of resistive elements.

6. The circuit device according to claim 5,
wherein the variable resistance circuit includes
a reference resistive element which is connected in series to the plurality of resistive elements, and
a trimming auxiliary switch, provided in parallel to the reference resistive element, which is turned off in a first measurement mode of the oscillation frequency before fuse cut, and is turned on in a second measurement mode of the oscillation frequency before the fuse cut.

7. The circuit device according to claim 1,
wherein the oscillation circuit is a CR oscillation circuit, and
the second frequency adjustment circuit is a variable capacitance circuit of the CR oscillation circuit.

8. The circuit device according to claim 7,
wherein the CR oscillation circuit includes an amplifier circuit, and
the variable capacitance circuit is provided to an output node of the amplifier circuit.

9. The circuit device according to claim 1, further comprising:
a voltage generation circuit that generates a power supply voltage, and supplies the power supply voltage to the oscillation circuit,
wherein the voltage generation circuit generates a power supply voltage for compensating for temperature characteristics of the oscillation frequency of the oscillation circuit.

10. The circuit device according to claim 9,
wherein the oscillation frequency in a case where the power supply voltage is a fixed voltage has positive temperature characteristics, and
the voltage generation circuit generates the power supply voltage having negative temperature characteristics on the basis of a work function difference of a transistor, and supplies the power supply voltage as a power supply of the oscillation circuit.

11. The circuit device according to claim 10,
wherein the voltage generation circuit supplies a first voltage as the power supply voltage when the physical quantity transducer which is connected to the circuit device is a first physical quantity transducer, and supplies a second voltage different from the first voltage as the power supply voltage when the physical quantity transducer which is connected to the circuit device is a second physical quantity transducer having a drive frequency different from that of the first physical quantity transducer.

12. The circuit device according to claim 9, wherein the voltage generation circuit supplies a first voltage as the power supply voltage when the physical quantity transducer which is connected to the circuit device is a first physical quantity transducer, and supplies a second voltage different from the first voltage as the power supply voltage when the physical quantity transducer which is connected to the circuit device is a second physical quantity transducer having a drive frequency different from that of the first physical quantity transducer.

13. The circuit device according to claim 1, wherein the detection circuit includes an A/D conversion circuit that performs a sampling operation of an input signal on the basis of a sampling clock signal which is the operation signal.

14. The circuit device according to claim 1, wherein the detection circuit includes a digital signal processing unit that performs digital signal processing on the basis of an operation clock signal which is the operation signal.

15. The circuit device according to claim 1, further comprising:

a drive circuit that receives a feedback signal from the physical quantity transducer, and drives the physical quantity transducer.

16. The circuit device according to claim 15, wherein when the oscillation frequency of the oscillation circuit is set to fos, i is set to an integer of 1 or greater, j is set to an integer of 1 or greater, and a frequency of the operation signal is set to fos/i, the oscillation frequency fos is set so that a relation of j×fdr≠fos/i is established, and wherein fdr corresponds to a drive frequency of the physical quantify transducer.

17. The circuit device according to claim 16, wherein when k is set to an integer of 1 or greater, the oscillation frequency fos is set so that a relation of j×fdr≠k×fos/i is established.

18. An electronic apparatus comprising the circuit device according to claim 1.

19. A moving object comprising the circuit device according to claim 1.

20. A method of manufacturing a physical quantity detection device including a physical quantity transducer and a circuit device, the method comprising:

manufacturing a circuit device that includes a clock signal generation circuit, including an oscillation circuit, which generates a clock signal through the oscillation circuit, and a detection circuit, including a circuit operating through an operation signal based on the clock signal, to which a detection signal from the physical quantity transducer is input;

firstly adjusting an oscillation frequency of the oscillation circuit before the physical quantity transducer and the circuit device are connected to each other; and secondly adjusting the oscillation frequency of the oscillation circuit in a state where the physical quantity transducer and the circuit device are connected to each other.

* * * * *